US012283797B2

(12) United States Patent
Kuzniak et al.

(10) Patent No.: US 12,283,797 B2
(45) Date of Patent: Apr. 22, 2025

(54) RISK REDUCTION OF ELECTRICAL HAZARDS

(71) Applicant: B.S.A.F.E. Manufacturing Incorporated, Oldcastle (CA)

(72) Inventors: Theodore R. Kuzniak, Essex (CA); James B. Erwied, Essex (CA); Michael H. Kramer, Oakville (CA); Gary J. Masse, LaSalle (CA); Todd R. Kuzniak, Belle River (CA); Joseph E. Zaleski, LaSalle (CA)

(73) Assignee: B.S.A.F.E. Manufacturing Incorporated, Oldcastle (CA)

( * ) Notice: Subject to any disclaimer, the term of this patent is extended or adjusted under 35 U.S.C. 154(b) by 649 days.

(21) Appl. No.: 17/536,719

(22) Filed: Nov. 29, 2021

(65) Prior Publication Data

US 2022/0085580 A1     Mar. 17, 2022

Related U.S. Application Data

(63) Continuation-in-part of application No. 16/734,841, filed on Jan. 6, 2020, now Pat. No. 11,211,776, which
(Continued)

(51) Int. Cl.
*H01H 9/22*     (2006.01)
*G01R 31/327*     (2006.01)
(Continued)

(52) U.S. Cl.
CPC ......... *H02B 1/306* (2013.01); *G01R 31/3275* (2013.01); *G08B 3/10* (2013.01);
(Continued)

(58) Field of Classification Search
None
See application file for complete search history.

(56) References Cited

U.S. PATENT DOCUMENTS

| 4,335,413 A | * | 6/1982 | Engel | ............... H01H 73/14 |
| | | | | 340/292 |
| 4,423,336 A | * | 12/1983 | Iverson | ............... H02J 9/06 |
| | | | | 307/64 |

(Continued)

OTHER PUBLICATIONS

Eaton, "Thinking outside the "big" box—Enhanced safety through isolation of line side power", 2 pages, Mar. 2016.
(Continued)

*Primary Examiner* — Courtney L Smith
(74) *Attorney, Agent, or Firm* — Quinn IP Law

(57) ABSTRACT

An apparatus includes an enclosure, a power switch, an absence of voltage detector controller, and an absence of voltage detector. The power switch is mounted inside the enclosure and configured to switch electrical power from a line-side power line to a load-side power line. The load-side power line is configured to transfer the electrical power outside of the enclosure to an industrial control panel. The absence of voltage detector controller is configured to determine a presence and an absence of each of a plurality of phases of the electric power on the load-side power line inside the enclosure. The absence of voltage detector is visible from external to the enclosure, has a switch, and is configured to illuminate one or more lamps indicating the absence of the electrical power on a corresponding one or more of the plurality of phases in response to a pressing of the switch.

20 Claims, 17 Drawing Sheets

Related U.S. Application Data is a continuation of application No. 16/272,149, filed on Feb. 11, 2019, now Pat. No. 10,530,133, which is a continuation-in-part of application No. 15/444,717, filed on Feb. 28, 2017, now Pat. No. 10,212,839.

(60) Provisional application No. 62/389,755, filed on Mar. 9, 2016.

(51) Int. Cl.
  *G08B 3/10* (2006.01)
  *H01H 9/26* (2006.01)
  *H02B 1/30* (2006.01)
  *H02B 1/44* (2006.01)
  *G08B 21/18* (2006.01)
  *H02B 1/42* (2006.01)

(52) U.S. Cl.
  CPC ............... *H01H 9/22* (2013.01); *H01H 9/26* (2013.01); *H02B 1/30* (2013.01); *H02B 1/44* (2013.01); *G08B 21/185* (2013.01); *H02B 1/42* (2013.01)

(56) References Cited

U.S. PATENT DOCUMENTS

| | | | |
|---|---|---|---|
| 5,642,256 A | 6/1997 | Pugh et al. | |
| 5,986,211 A | 11/1999 | Greer et al. | |
| 7,348,510 B1 | 3/2008 | Foley et al. | |
| 7,462,792 B1 | 12/2008 | Hellmers et al. | |
| 7,724,507 B2 | 5/2010 | Whitt et al. | |
| 8,291,657 B2 | 10/2012 | White | |
| 8,720,724 B1 | 5/2014 | Lynn, IV | |
| 9,683,391 B2 | 6/2017 | Johnson et al. | |
| 9,692,254 B2 | 6/2017 | Tomassi | |
| 9,735,555 B2 * | 8/2017 | Fishovitz | H02B 11/133 |
| 2005/0036248 A1 | 2/2005 | Klikic et al. | |
| 2005/0224323 A1 | 10/2005 | Bortolloni et al. | |
| 2007/0132458 A1 | 6/2007 | Brown, Jr. | |
| 2008/0055846 A1 | 3/2008 | Clidaras et al. | |
| 2008/0094782 A1 | 4/2008 | Mason | |
| 2008/0284614 A1 | 11/2008 | Perez et al. | |
| 2009/0021925 A1 | 1/2009 | Heimann et al. | |
| 2010/0110616 A1 | 5/2010 | Edel | |
| 2010/0208433 A1 | 8/2010 | Heimann et al. | |
| 2011/0216508 A1 * | 9/2011 | Faulkner | H02B 11/127 361/724 |
| 2013/0026856 A1 | 1/2013 | Grindeland | |
| 2013/0279049 A1 * | 10/2013 | Van Fossen | B60L 3/0069 361/42 |
| 2016/0241114 A1 * | 8/2016 | Cullen | H02K 11/28 |

OTHER PUBLICATIONS

Panduit, "VeriSafe Absence of Voltage Tester", 6 pages, Oct. 2019, United States of America.

* cited by examiner

RISK REDUCTION OF ELECTRICAL HAZARDS

This application relates to U.S. application Ser. No. 16/734,841, filed Jan. 6, 2020, which relates to U.S. application Ser. No. 16/272,149, filed Feb. 11, 2019, now U.S. Pat. No. 10,530,133, which relates to U.S. application Ser. No. 15/444,717, filed Feb. 28, 2017, now U.S. Pat. No. 10,212,839, which relates to U.S. Provisional Application No. 62/389,755, filed Mar. 9, 2016, each of which are hereby incorporated by reference in their entirety.

FIELD OF THE INVENTION

The invention relates to industrial control power distribution generally and, more particularly, to a method and/or apparatus for implementing risk reduction of electrical hazards.

BACKGROUND

Per the North American workplace electrical safety standards published by the National Fire Protection Association and the Canadian Standards Association, a conventional industrial control panel is considered energized until validated to be de-energized. The validation is completed using an adequately rated voltage detector. Depending on a risk category of the installation being serviced, personal protection equipment of varying degrees is worn by an electrical worker to complete the validation as the validation involves the electrical worker being within a prohibited approach boundary of the electrical hazard.

After a main power disconnect switch has been opened and a load side circuit confirmed de-energized, a top area of the main power disconnect switch inside the industrial control panel is still energized. With a door of the industrial control panel open, the presence of live conductors exposes the electrical worker to potential electrocution and arc-flash hazards. In such a case, the appropriate personal protection equipment should be worn the entire time the panel is being worked on by the electrical worker. The personal protection equipment for typical industrial installations is expensive, cumbersome and time consuming to don.

It would be desirable to implement a method and/or apparatus for implementing risk reduction of electrical hazards.

SUMMARY

The invention concerns an apparatus including an enclosure, a power switch, an absence of voltage detector controller, and an absence of voltage detector. The power switch is mounted inside the enclosure and configured to switch electrical power from a line-side power line to a load-side power line. The load-side power line is configured to transfer the electrical power outside of the enclosure to an industrial control panel. The absence of voltage detector controller is configured to determine a presence and an absence of each of a plurality of phases of the electric power on the load-side power line inside the enclosure. The absence of voltage detector is visible from external to the enclosure, has a switch, and is configured to illuminate one or more lamps indicating the absence of the electrical power on a corresponding one or more of the plurality of phases in response to a pressing of the switch.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing a method and/or apparatus for implementing risk reduction of electrical hazards that may (i) reduce a risk of shock and arc-flash hazards, (ii) reduce a risk of shock and arc-blast hazards, (iii) augment existing industrial control panels, (iv) provide low-voltage power inside the industrial control panel, (v) provide interlocks of the doors and/or (vi) be implemented in one or more housings.

Embodiments of the invention generally provide an isolated control panel (or enclosure) attachable to a common industrial control panel. The isolated control panel may allow an interior of the industrial control panel to be de-energized of all potentially-lethal electrical power. The de-energization of the interior of the industrial control panel generally eliminates shock hazards and adds a second line and a third line of defense against arc-flash and/or arc-blast hazards.

The isolated control panel may allow employers to formulate realistic electrical safety policies and procedures for qualified employees accessing the industrial control panel. The isolated control panel may also provide relevant worker safety while maximizing plant operational efficiency and further assists the employer in making sound hazard assessments at each installation. The de-energization of the industrial control panel may simplify work practices to prevent electric shock and/or other injuries resulting from either direct or indirect electrical contacts. In many instances, the isolated control panel, as part of a complete company electrical safety policy and procedure, may provide enough adequate risk reduction of a particular installation as to lower the level of personal protection equipment used by the qualified employee when entering the locked out industrial control panel.

Figure 1:
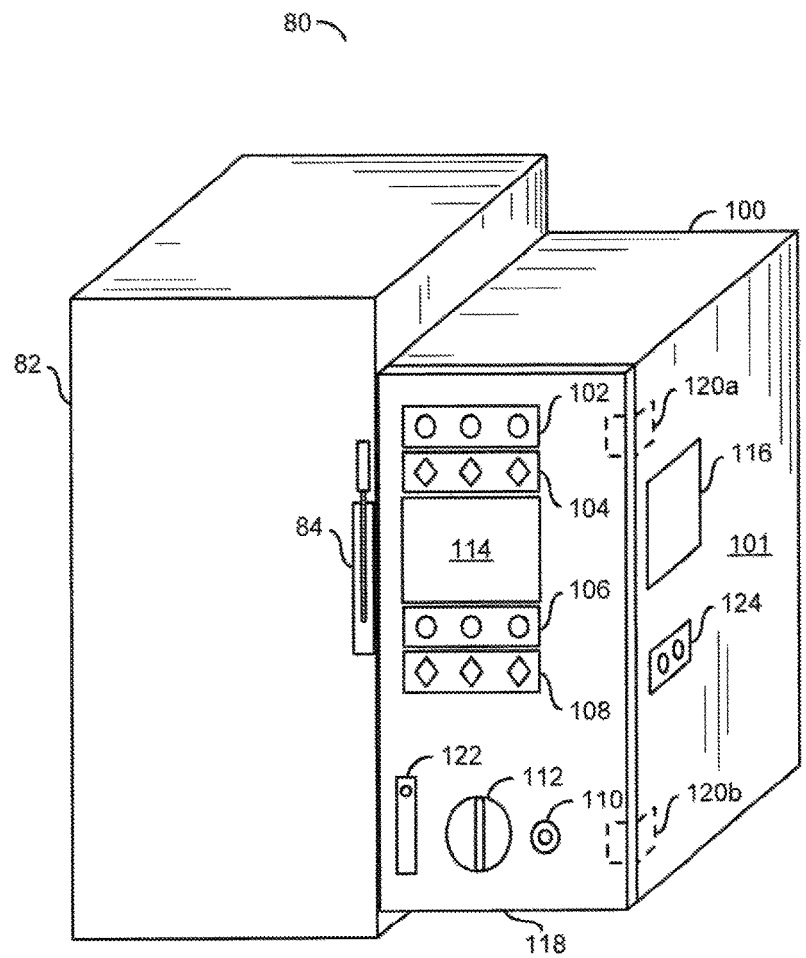
FIG. 1 is a diagram of a system.

Referring to FIG. 1, a diagram of a system 80 is shown. The system (or apparatus) 80 generally comprises an enclosure (or housing) 82 and an enclosure (or housing) 100. The enclosure 82 may implement a common industrial control panel. The enclosure 100 may implement an isolated control panel. The isolated control panel 100 may be mechanically attachable to an external side of the industrial control panel 82.

The industrial control panel 82 may be operational to switch and/or route high-voltage electrical power (e.g., 575 volts AC three-phase power) from an input source to one or more external loads. The industrial control panel 82 generally comprises a handle (or lever) 84 mounted on a front of the industrial control panel 82. The handle 84 may implement a main power disconnect handle having an "on" position and an "off" position. The main power disconnect handle 84 may include a typical interlock mechanism that prevents a door of the industrial control panel 82 from opening while the main power disconnect handle 84 is in the "on" position. The interlock mechanism may allow the door of the industrial control panel 82 to be manually opened while the main power disconnect handle 84 is in the "off" position.

The isolated control panel 100 generally comprises an enclosure (or housing) 101 and a door 118. The enclosure 101 generally comprises multiple indicators (or lights) 102, multiple test points (or stations) 104, multiple indicators (or lights) 106, multiple test points (or stations) 108, an indicator (or light) 110, a lever (or switch) 112, a window 114, an optional window 116, multiple hinges 120a-120b, a lever (or handle) 122 and one or more blocks (or circuits) 124.

The enclosure 101 may implement a rectangular-shaped box. The enclosure 101 may be configured to house various components and provide mechanical protection against electrical shock hazards, arc-flash hazards and/or arc-blast hazards. The enclosure 101 may be fabricated of an electrically conductive material (e.g., steel) and is electrically connected to the industrial control panel 82 for grounding purposes. In various embodiments, the enclosure 101 may be several feet tall (e.g., 46 inches), by approximately a foot wide (e.g., 15 inches) and approximately a foot deep (e.g., 12 inches). Other dimensions may be implemented to meet the design criteria of a particular application.

The indicators 102 may implement multi-phase (e.g., three-phase) line-side voltage indicators. Each line-side voltage indicator 102 may be operational to illuminate while electrical power is present on a corresponding line-side power supply line. If electrical power is absent from any one or more of the line-side power supply lines, the corresponding line-side voltage indicator 102 may be dark. In some embodiments, the line-side voltage indicators 102 may be mounted in the door 118.

The test points 104 may implement multi-phase (e.g., three-phase) line-side non-contact or high-impedance touch-test-point voltage test stations. Each test station 104 may be operational to provide test voltages indicative of the voltage on a corresponding line-side power supply line (e.g., phase-to-phase voltages and/or phase-to-ground voltages). The test stations 104 may be configured to provide electrical isolation between the line-side power supply lines and contact points on the exterior of the test stations 104. In some embodiments, the test stations 104 may be mounted in the door 118.

The indicators 106 may implement multi-phase (e.g., three-phase) load-side voltage indicators. Each load-side voltage indicator 106 may be operational to illuminate while electrical power is present on a corresponding load-side power supply line. If electrical power is absent from any one or more of the load-side power supply lines, the corresponding load-side voltage indicator 104 may be dark. In some embodiments, the line-side voltage indicators 106 may be mounted in the door 118.

The test points 108 may implement multi-phase (e.g., three-phase) load-side non-contact or high-impedance touch-test-point voltage test stations. Each test station 108 may be operational to provide test voltages indicative of the voltage on a corresponding load-side power supply line (e.g., phase-to-phase voltages and/or phase-to-ground voltages). The test stations 108 may be configured to provide electrical isolation between the load-side power supply lines and contact points on the exterior of the test stations 108. In some embodiments, the test stations 108 may be mounted in the door 118.

The light 110 may implement a control power status light for low-voltage. The control power status light 110 may be visible from the exterior of the enclosure 101. The control power status light 110 may be illuminated while a low-voltage power is present inside the enclosure 101. The control power status light 110 may be dark while the low-voltage power is absent from inside the enclosure 101. In various embodiments, the control power status light 110 may be mounted in the door 118.

The lever 112 may implement a control power disconnect lever. In some embodiments, the lever 112 may be a fused control power disconnect lever. The control power disconnect lever 112 is generally operational to switch electrical supply power to a power converter that generates one or more lower voltages (e.g., 120 volts AC single-phase power and/or 24 volt DC power). While the control power disconnect lever 112 is in an "on" position, the electrical power may be transferred from a power line to the power converter inside the isolated control panel 100. While the control power disconnect lever 112 is in an "off" position, the electrical power may be isolated from the power converter.

The window 114 may implement an explosion proof front viewing window. The window 114 may provide a view of the interior of the enclosure 101. In various embodiments, the front window 114 may be positioned on the door 118 to show a front view of a main power disconnect switch. Other locations of the window 114 may be implemented to meet the design criteria of a particular application.

The window 116 may implement an explosion proof side viewing window. The side window 116 may provide another view of the interior of the enclosure 101 from a different angle than the window 114. In various embodiments, the side window 116 may be positioned on a side of the enclosure 101 to show a side view of the main power disconnect switch. Other locations of the window 116 may be implemented to meet the design criteria of a particular application.

The hinges 120a-120b may be configured to pivotally attach the door 118 to the enclosure 101. While two hinges 120a-120b are illustrated, other numbers of hinges may be implemented. In some embodiments, a single piano-style hinge may be used to secure the door 118 to the enclosure 101.

The lever 122 may implement a door lever. The lever 122 is generally operational to hold the door 118 shut while the door 118 is closed and the lever 122 is in a "closed" position.

While the lever 122 is in an "open" position, the door 118 may be free to rotate about the hinges 120a-120b, if safety interlocks permit.

The circuit 124 may implement one or more low-voltage (e.g., 120 volt AC) receptacles. The receptacles 124 may receive single-phase electrical power from the power converter. While electrical power is present in the power converter, a power line may transfer the electrical power (e.g., 120 volt AC power) through a power line to the receptacles 124. One or more of the receptacles 124 may be mounted on a side surface (as illustrated), top surface and/or bottom surface of the enclosure 101 and may be accessible from outside the enclosure 101. In various embodiments, one or more receptacles 124 may be mounted in the door 118. In some embodiments, one or more receptacles 124 may be mounted inside the enclosure 101.

Figure 2:
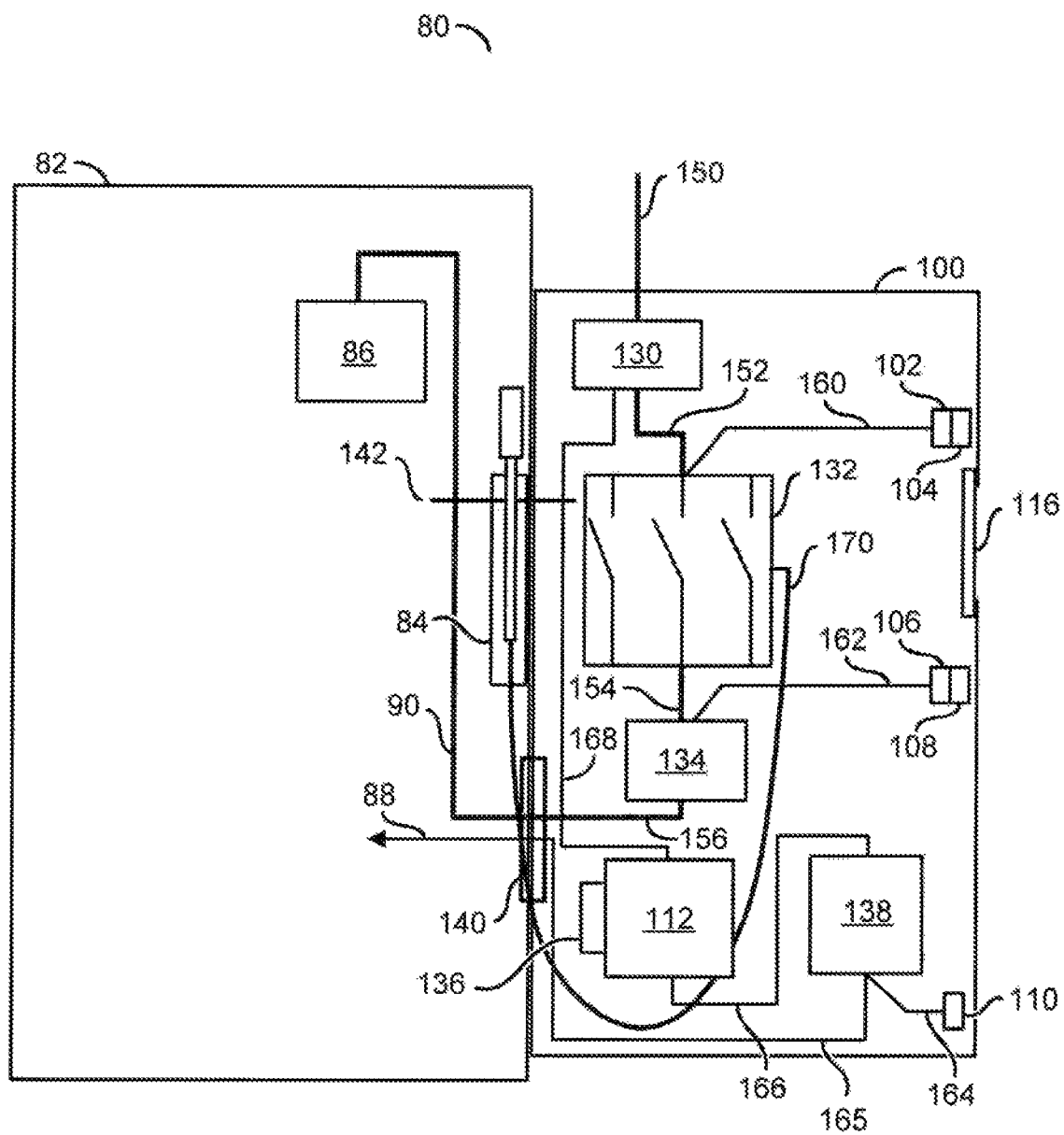
FIG. 2 is a block diagram of the system in accordance with an embodiment of the invention.

Referring to FIG. 2, a block diagram of an example implementation of the system 80 is shown in accordance with an embodiment of the invention. The industrial control panel 82 generally includes the main power disconnect handle 84, a branch circuit protector 86, a low-voltage wire 88 and a power line 90. The isolated control panel 100 generally includes the line-side voltage indicators 102, the line-side test station 104, the load-side voltage indicators 106, the load-side test station 108, the control power status light 110, the control power disconnect lever 112, the front window 114 and the side window 116. The isolated control panel 100 may also comprise a block (or circuit) 130, a block (or circuit) 132, a block (or circuit) 134, an interlock device (or mechanism) 136, one or more blocks (or circuits) 138, an interlock device (or mechanism) 142, a power line (or wire) 150, a power line (or wire) 152, a power line (or wire) 154, a power line (or wire) 156, a power line (or wire) 160, a power line (or wire) 162, a power line (or wire) 164, a power line (or wire) 165, a power line (or wire) 166, and a cable actuator (or link) 170.

The circuit 130 may implement a line-side power distribution block. The line-side power distribution block 130 is generally operational to distribute multiple-phase (e.g., three-phase) line-side electrical power from the multi-phase power line 150 to the circuit 132. The electrical power may be transferred from the line-side power distribution block 130 to the block 132 via the multi-phase line-side power line 152. In various embodiments, the line-side power distribution block 130 may also distribute single-phase electrical power to the control power disconnect lever 112 via the power line 168. The current available on the power lines 150, 152 and 168 may be a hazardous available fault current.

The circuit 132 may implement a main power disconnect switch. The main power disconnect switch 132 is generally operational to alternately connect and disconnect the multi-phase electrical power received from the line-side power distribution block 130 to the circuit 134 via the load-side power line 154. The main power disconnect switch 132 may be controlled by the cable actuator 170. In some embodiments, the power lines 150 and 168 may be connected directly to the main power disconnect switch 132 and the line-side power distribution block 130 may be eliminated. The multi-phase electrical power received by the main power disconnect switch 132 may also be transferred to the line-side voltage indicator 102 and the line-side test station 104 via the multi-phase power line 160.

The circuit 134 may implement a load-side power distribution block. The load-side power distribution block 134 is generally operational to distribute multiple-phase (e.g., three-phase) load-side electrical power received from the main power disconnect switch 132 to the industrial control panel 82 via the multi-phase power line 156. The electrical power from the output side of the load-side power distribution block 134 may be connected to the branch circuit protector 86, located in the industrial control panel 82. The power line 156 may pass through one or more apertures 140 in the walls of the isolated control panel 100 and continue in the industrial control panel 82 as the power line 90. The power line 90 is generally connected to the branch circuit protector 86. The multi-phase electrical power received by the load-side power distribution block 134 may also be transferred to the load-side voltage indicator 106 and the load-side test station 108 via the multi-phase power line 162.

The interlock device 136 is generally operational to keep the door 118 in the closed position while the control power disconnect lever 112 is in the "on" position. While the control power disconnect lever 112 is in the "off" position, the interlock device 136 may allow the door 118 to be open, if the door lever 122 and the interlock device 142 permit.

Each circuit 138 may implement a power converter circuit (one shown for clarity). Each power converter 138 is generally operational to convert single-phase electrical power received from the control power disconnect lever 112 into low-voltage electrical power (e.g., 24 volts DC power or 120 volts AC power). The single-phase electrical power may be transferred via the power line 166. In some embodiments, a single power converter 138 may be implemented. In other embodiments, multiple (e.g., 2) power converters 138 may be implemented, each generating the same type or a different type of low-voltage electrical power. For example, the power converter 138 may implement a transformer and/or rectifier that converts 600 volt AC electrical power or 480 volt AC electrical power to 120 volt AC electrical power and/or 24 volt DC electrical power.

Single-phase electrical power may be received by the power converter 138 from the line-side power distribution block 130 through the control power disconnect lever 112. While the control power disconnect lever 112 is in the "on" position, electrical power may be supplied from the line-side power distribution block 130, through power line 168, through the control power disconnect lever 112, and through the power line 166 to the power converter 138. While the control power disconnect lever 112 is in the "off" position, no electrical power is provided to the power converter 138.

The low-voltage power may be presented by the power converter 138 on the power lines 164 and 165 while electrical power is received on the power line 166. The power line 164 may transfer the low-voltage power to the control power status light 110. The power line 165 may transfer the low-voltage power through one or more of the apertures 140 where the line continues inside the industrial control panel 82 as the low-voltage wire 88.

The apertures 140 may be implemented as gasketed apertures. The apertures 140 are generally configured to provide passage between an interior of the industrial control panel 82 and an interior of the isolated control panel 100. The apertures 140 may convey multiple power lines/wires and the cable actuator 170.

The interlock device 142 is generally configured to prevent the door 118 of the isolated control panel 100 and/or a door of the industrial control panel 82 from opening when the main power disconnect handle 84 is in the "on" position. The interlock device 142 may be defeatable with a standard tool. The interlock device 142 may also prevent the main power disconnect handle 84 from moving from the "off" position to the "on" position when the door 118 of the isolated control panel 100 and/or the door of the industrial control panel 82 is open. The locking feature of the interlock device 142 with the main power disconnect handle 84 may also be defeatable with a standard tool.

The cable actuator 170 generally provides a mechanical link between the main power disconnect switch 132, located inside the isolated control panel 100, and the main power disconnect handle 84, located on the industrial control panel 82. The cable actuator 170 may be connected such that operating the main power disconnect handle 84 also operates the main power disconnect switch 132 in a synchronic manner. The cable actuator 170 may pass between the isolated control panel 100 and the industrial control panel 82, through at least one of the apertures 140.

Figure 3:
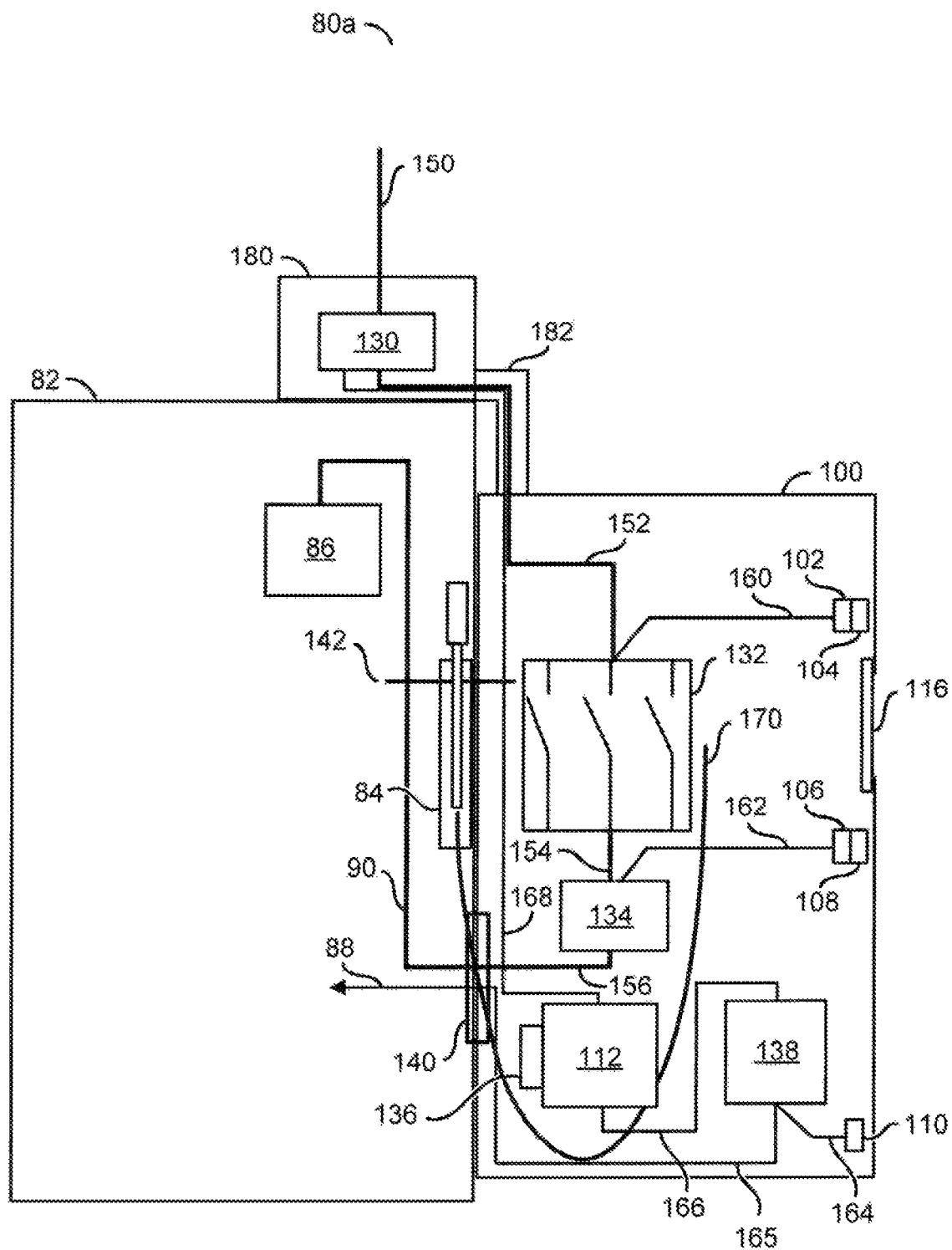
FIG. 3 is a block diagram of a variation of the system.

Referring to FIG. 3, a block diagram of another example implementation of a system 80a is shown. The system 80a may be a variation of the system 80. The system 80a generally comprises the system 80 with an additional enclosure (or housing) 180 and a conduit 182. The line-side power distribution block 130 may be mounted in the enclosure 180. The enclosure 180 may be mounted to a top of the industrial control panel 82. The multi-phase power line 150 may be received by the line-side power distribution block 130. The ridged conduit 182 may convey the multi-phase power line 152 from the line-side power distribution block 130 to the main power disconnect switch 132. The conduit 182 may also convey the power line 168 from the line-side power distribution block 130 to the control power disconnect lever 112.

Figure 4:
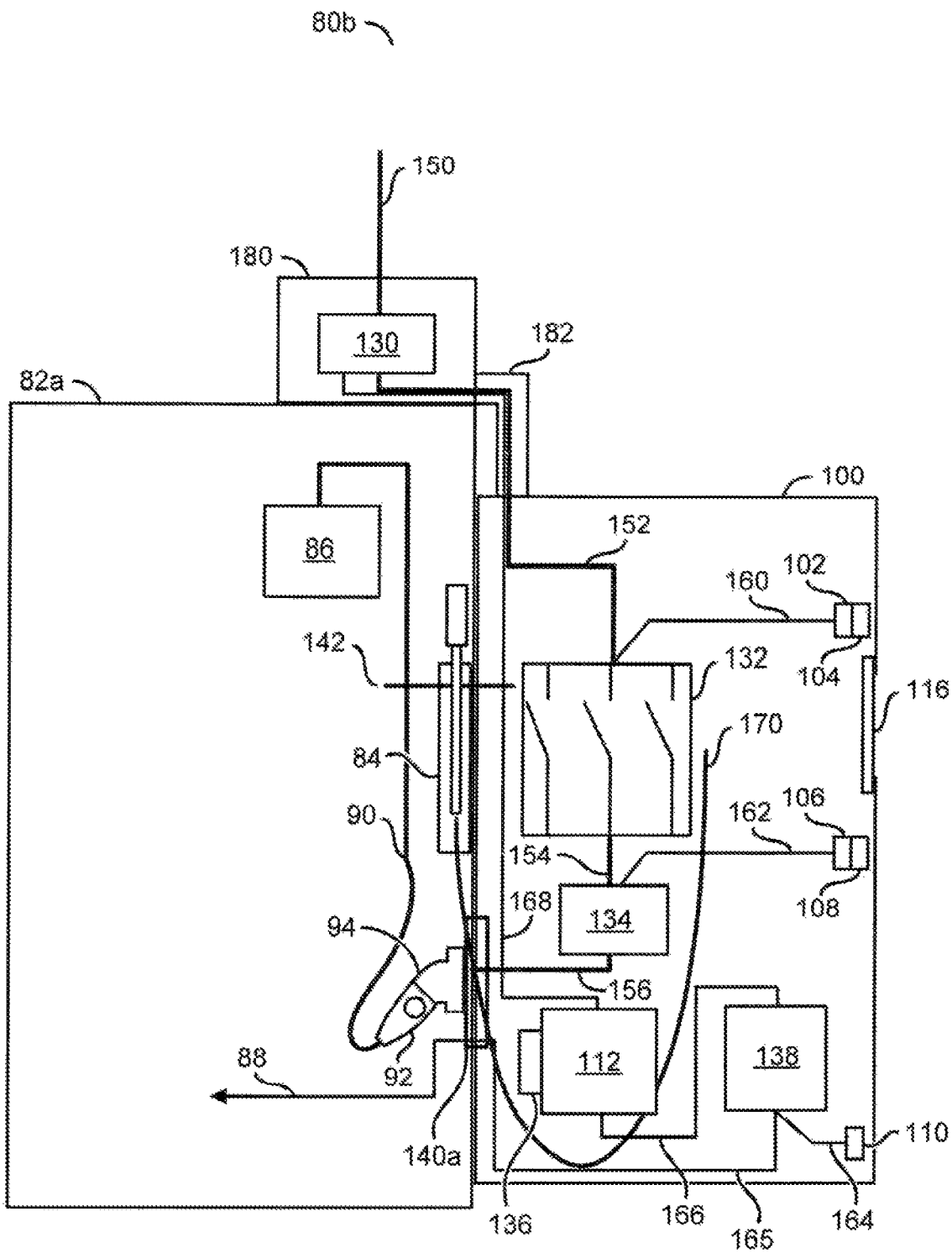
FIG. 4 is a block diagram of another variation of the system.

Referring to FIG. 4, a block diagram of another example implementation of a system 80b is shown. The system 80b may be a variation of the system 80a with a modified industrial control panel 82a. The power from the output side of the load-side power distribution block 134 may be connected to the branch circuit protector 86 located in the industrial control panel 82a, as in the system 80a. The multi-phase power line 156 generally passes through the one or more apertures 140a of the isolated control panel 100 and the industrial control panel 82a. The apertures 140a may transfer the electrical power to the power line 90 through the use of a rated disconnect plug 92 and a corresponding receptacle 94.

Figure 5:
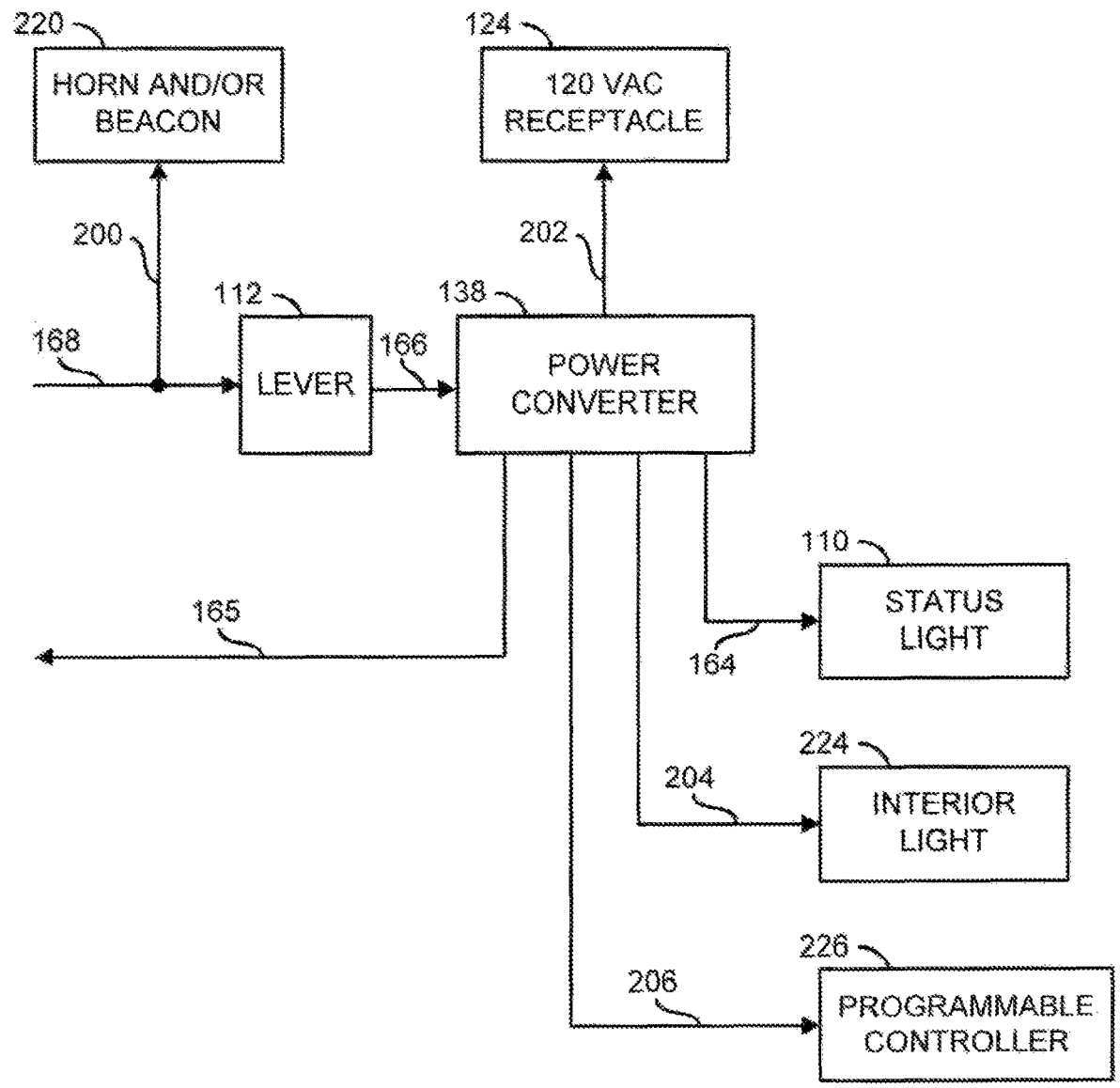
FIG. 5 is a block diagram of a portion of an isolated control panel.

Referring to FIG. 5, a block diagram of an example implementation of a portion of the isolated control panel 100 is shown. The isolate control panel 100 may include the control power status light 110, the receptacles 124, the power converter 138, a block (or circuit) 220, a block (or circuit) 224 and a block (or circuit) 226. The isolated control panel 100 may also include a power line (or wire) 200, a power line (or wire) 202, a power line (or wire) 204 and a power line (or wire) 206.

The circuit 220 may implement a horn and/or a beacon. The horn/beacon may be operational to trigger while the door 118 is open and electrical power is present on the line-side power distribution block 130. While electrical power is present on the line-side power distribution block 130, the power line 168 may transfer the electrical power to the power line 200 and to the horn/beacon 220. A power line 202 may provide electrical power from the power converter 138 to the receptacles 124. The power line 164 may provide electrical power to the control power status light 110.

The circuit 224 may implement a light on the interior of the enclosure 101. The interior light 224 may be powered from the power converter 138 via the power line 204. The interior line 224 may include an exterior on/off switch that enables the interior light 224 to be switched on when desired, and off when not in use.

The circuit 226 may implement a programmable controller. The programmable 226 may be operational to monitor various auxiliary signals inside the enclosure 101 and report the status of the auxiliary signals to a remote monitoring station. The programmable controller 226 may be powered by the power converter 138 through the power line 206.

Figure 6:
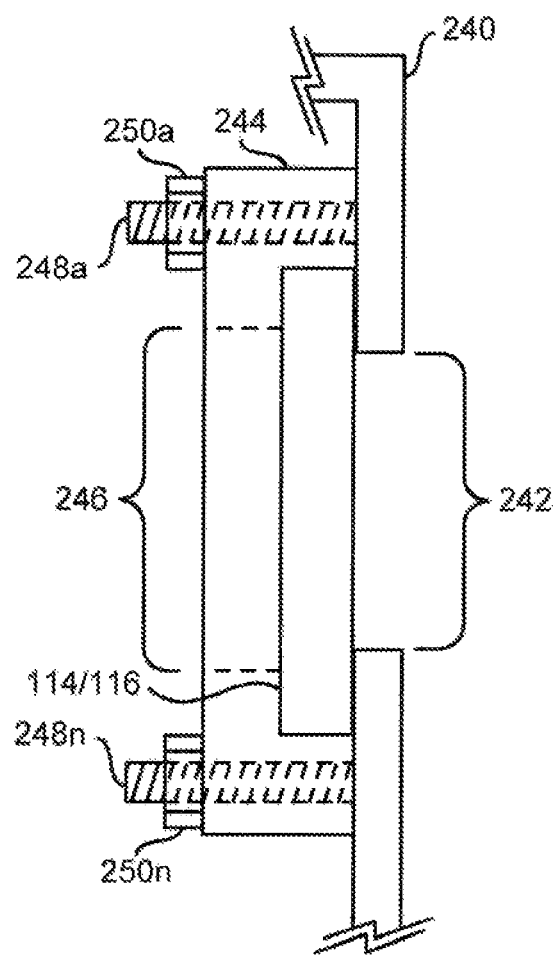
FIG. 6 is a diagram of a mounting for a window.

Referring to FIG. 6, a diagram of an example mounting of a window is shown. The window illustrated may be representative of the front window 114 and/or the side window 116. A wall 240 of the isolated control panel 100 may include an opening 242 for each window. For the front window 114, the opening 242 may be formed in the door 118. For the side window 116, the opening 242 may be formed in the enclosure 101. In some embodiments, the opening 242 may be generally rectangular in shape. Other shapes of openings may be implemented to meet the design criteria of a particular application. Each window 114/116 may be mounted on an interior side of the wall 240. Any pressure created by an arc-flash and/or arc-blast inside the isolated control panel 100 generally forces the windows 114 and 116 against the wall 240, thereby containing the pressure and preventing an electrical worker (or operator or person) and/or bystander from being exposed to the blast.

Respective frames 244 may be configured to hold the windows 114 and 116 against the wall 240. Each frame 244 may include an opening 246 aligned with the opening 242. The opening 246 may be generally rectangular in shape. Other shapes of openings may be implemented to meet the design criteria of a particular application. Multiple (four) bolts 248a-248n may be welded to the wall 240 proximate each window 114/116. The bolts 248a-248n may be inserted into corresponding holes in the frame 244 to allow the frame 244 to encapsulate the window 114/116. Multiple nuts 250a-250n may be tightened to the bolts 248a-248n to secure the frame 244 and the window 114/116 to the wall 240.

Figure 7:
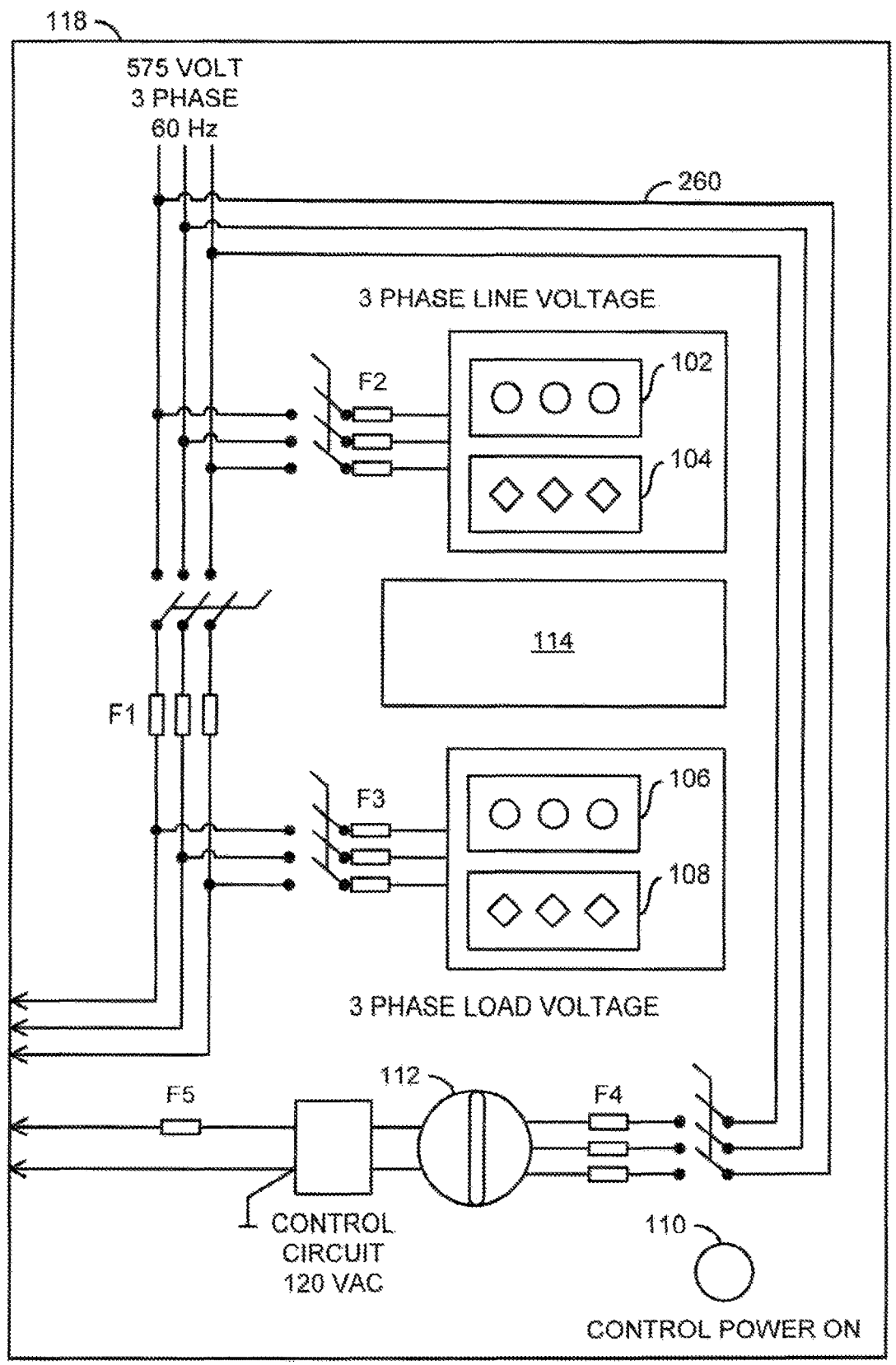
FIG. 7 is a diagram of a door sticker.

Referring to FIG. 7, a diagram of an example implementation of a sticker located on an exterior side of the door 118 is shown. The sticker may include a schematic (or wiring diagram) 260 of the electrical power routing, fuses (e.g., F1, F2, F3 and F4), and switches included in the isolated control panel 100. The schematic 260 generally allows the electrical worker to see how the electrical power is routed from the top of the isolated control panel 100 (e.g., 575 volt 3-phase 60 Hertz line-side electrical power) to the electrical power transferred to the industrial control panel 82 at the lower lefthand side of the schematic 260.

Figure 8:
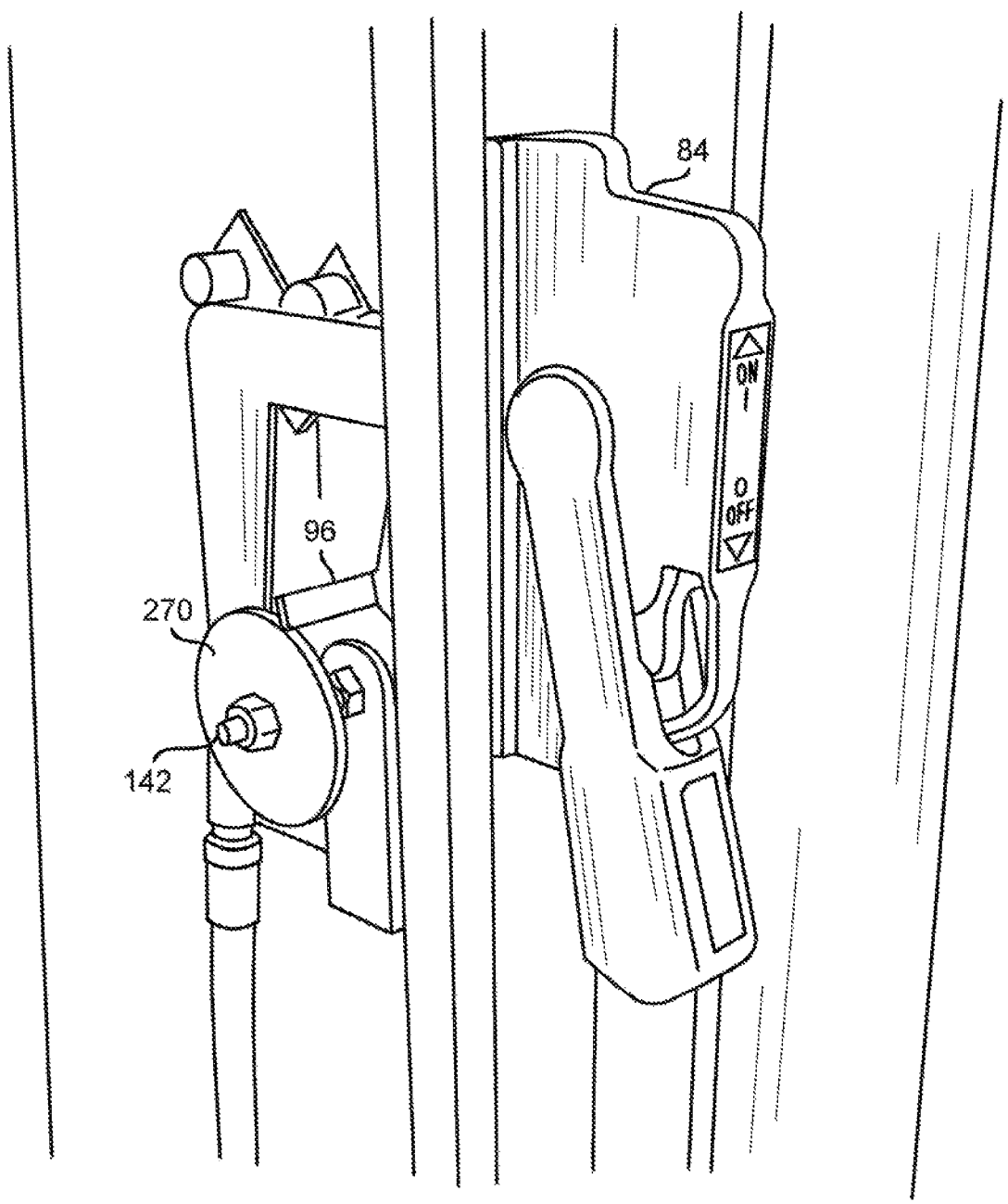
FIG. 8 is a perspective diagram of a portion of an interlock device within the industrial control panel.

Referring to FIG. 8, a perspective diagram of an example implementation of a portion of the interlock device 142 within the industrial control panel 82 is shown. The interlock device 142 may include a disk 270. While the door 118 of the isolated control panel 100 is open, the disk 270 may be biased by a spring to reside in the path of a defeater lever 96 of the main power disconnect handle 84. As shown, the disk 270 may reside in a "de-energized" position that prevents the defeater lever 96 from being moved downward. With the defeater lever 96 in an upward position, as shown, the main power disconnect handle 84 cannot be moved from the "off" position to the "on" position. The disk 270 may prevent the main electrical power from being turned on inside the industrial control panel 82 and inside the isolated control panel 100 on the load side past the main power disconnect switch 132.

Figure 9:
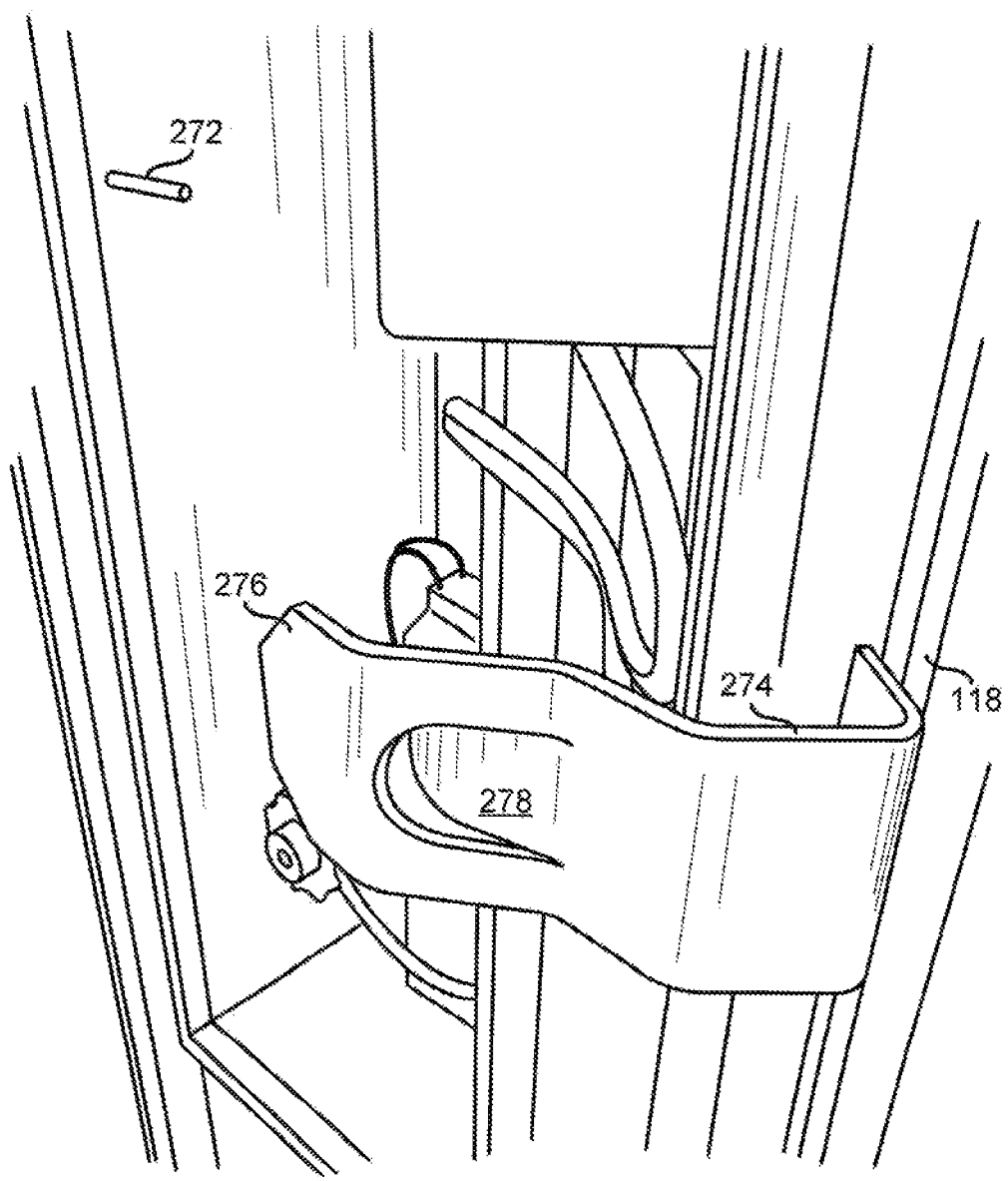
FIG. 9 is a perspective diagram of a portion of the interlock device within the isolated control panel.

Referring to FIG. 9, a perspective diagram of a portion of the interlock device 142 within the isolated control panel 100 is shown. The interlock device 142 may further include a rod 272 attached to the disk 270, and a latch 274 attached to the door 118. With the door 118 open, as shown, the rod 272 and disk 270 are biased toward the isolated control panel 100 and may prevent the defeater lever 96 from being moved downward.

As the door 118 of the isolated control panel 100 is closed, a flange 276 of the latch 274 may engage a free end of the rod 272. As the door 118 continues to close, the flange 276 generally pushes the rod 272 and disk 270 toward the industrial control panel 82 (e.g., to the left as illustrated) to an "intermediate" position. The movement caused by the flange 276 may be sufficient to cause the disk 270 to disengage the defeater lever 96.

When door 118 reaches a fully closed position, the rod 272 may fall into a slot 278 of the latch 274. With the rod 272 in the slot 278, the disk 270 may be in an "energized" position and remain disengaged from the defeater lever 96. The electrical work may now switch the main power disconnect handle 84 from the "off" position to the "on" position by causing the defeater lever 96 to move downward with a tool. With the main power disconnect handle 84 in the "on" position, the cable actuator 170 may close the main power disconnect switch causing the multi-phase electrical power to flow into the industrial control panel 82 from the isolated control panel 100.

The slot 278 may be shaped to interfere with the rod 272 while the door 118 is in the closed position. Any attempt to open the door 118 with the interlock device 142 in the "energized" position may be blocked by the rod 272 striking against the latch 274. The interlock device 142 generally prevents the door 118 from being opened if the main power disconnect handle 84 is in the "on" position or in the "off" position.

To return the interlock device 142 to the "de-energized" position, the electrical worker generally opens the industrial control panel 82 and pulls the disk 270 away from the isolated control panel 100 to the "intermediate" position. While the disk 270 is in the "intermediate" position, the door 118 of the isolated control panel 100 may be opened by the operator. Once the latch 274 is clear of the rod 272, the operator may release the disk 270, allowing the disk 270 to be biased back into the "de-energized" position by the spring.

Figure 10:
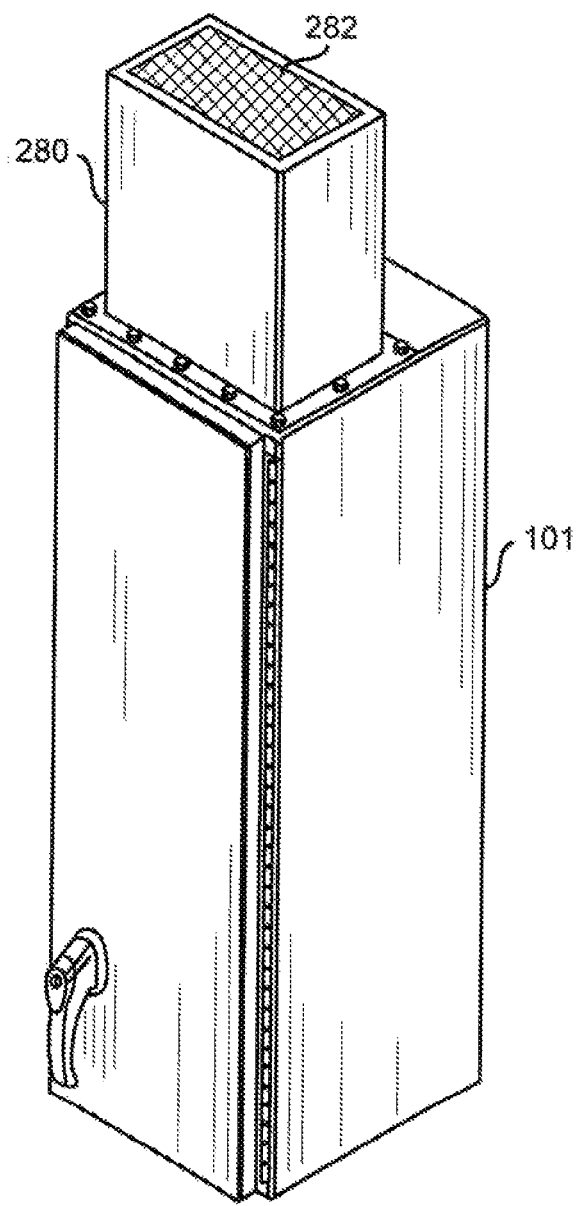
FIG. 10 is a perspective diagram of a relief chamber.

Referring to FIG. 10, a perspective diagram of an example implementation of a relief chamber 280 is shown. The relief chamber 280 may be attached to a side (e.g., a top side) of the enclosure 101 over an opening in the wall of the enclosure 101. An end of the relief chamber 280 furthest from the enclosure 101 may include a screen area 282. The screen area 282 is generally designed to allow hot gasses and flames from an arc-flash and/or arc-blast to pass through of the relief chamber 280 out into the surrounding atmosphere in a predetermined direction. The screen area 282 is generally oriented such that the hot gasses and flames are directed away from an area in front of the door 118 where the electrical worker is commonly standing.

Figure 11:
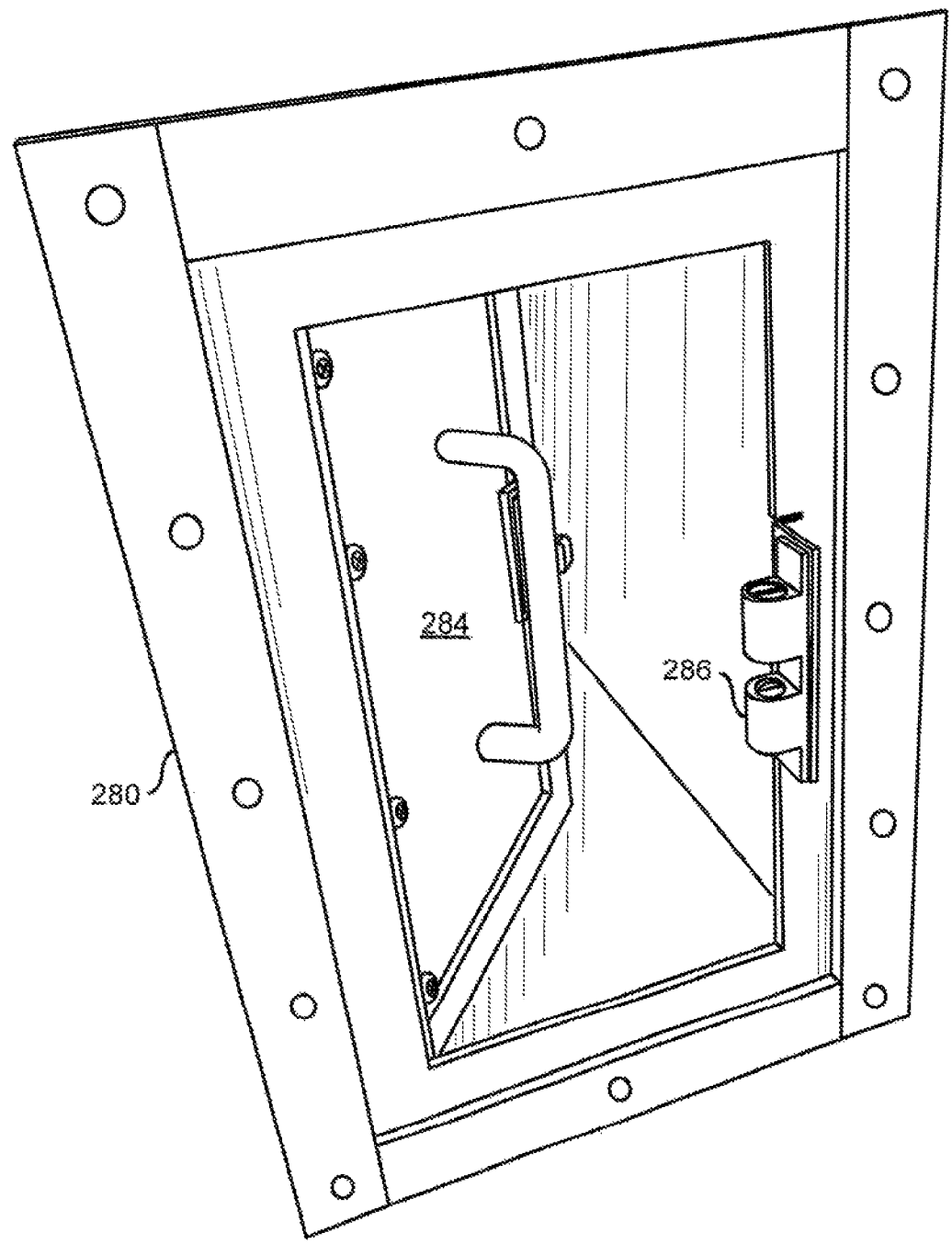
FIG. 11 is a perspective diagram of the relief chamber from an enclosure side.

Referring to FIG. 11, a perspective diagram of the relief chamber 280 from the enclosure 101 side is shown. The relief chamber 280 generally includes a door 284 and a latch 286. The door 284 may be hinged to swing into an interior of the relief chamber 280. The door 284 may include a handle. The latch 286 is generally configured to hold the door 284 in a closed position.

In normal use, the latch 286 generally holds the door 284 in the closed position. The closed door 284 may keep the interior of the isolated control panel 100 sealed from the outside environment. When an over-pressure situation from an arc-flash and/or arc-blast occurs, the pressure may push against the door 284. The latch 286 is generally configured to release the door 284 when a specified pressure is reached. For example, the latch 286 may release when approximately 30 to 60 pounds per square inch of pressure is exerted (e.g., from a 2,000 ampere arc at 4 inches away). The pressure may push the door 284 open allowing the hot gases and/or flames to pass into the relief chamber 280 and subsequently out through the screen area 282.

Figure 12:
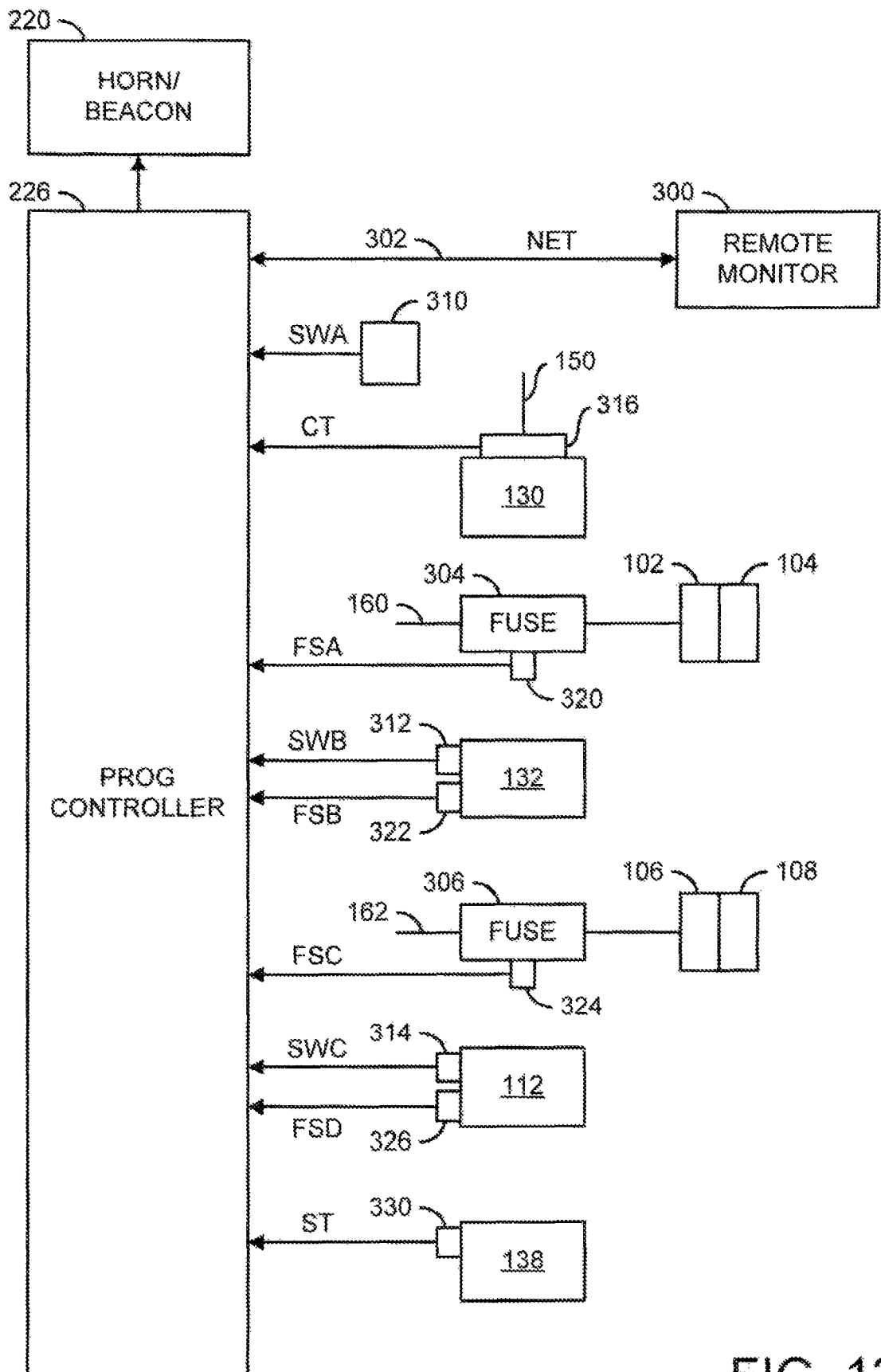
FIG. 12 is a block diagram of a remote monitoring configuration.

Referring to FIG. 12, a block diagram of an example remote monitoring configuration is shown. All or some of the devices inside the isolated control panel 100 may be fitted with auxiliary signaling components (or sensors) that receive low-voltage electrical power. Each auxiliary signaling component may provide one or more sensor signals to the programmable controller 226. The programmable controller 226 generally monitors the status of each signal to determine a status of each corresponding device. The status of the devices may be pushed by the programmable controller 226 to a remote monitor 300 outside the isolated control panel 100. Bidirectional communication between the programmable controller 226 and the remote monitor 300 may be provided via a network (or communication channel) 302. In various embodiments, the network 302 may be implemented as a wired network and/or a wireless network. In some implementations, the network 302 may include, but is not limited to, an Ethernet network, a Wi-Fi network or a cellular network. Other networks may be implemented to meet the design criteria of a particular application.

The remote monitor 300 may be a standard information technology (IT) system so that any outside entity may monitor and track such things as maintenance work (downtime), a circuit protector failure, an open door alarm, power consumption, etc. The programmable controller 226 may also be used for local annunciation. For example, the programmable controller 226 may control the horn/beacon 220 based on signals received from the auxiliary signaling components.

The isolated control panel 100 may include a fuse (or circuit breaker) 304 on the power line 160 and a fuse (or circuit breaker) 306 on the power line 162. The auxiliary signaling components generally comprise a sensor (or switch) 310, a sensor (or switch) 312, a sensor (or switch) 314, a sensor (or monitor) 316, a sensor (or monitor) 320, a sensor (or monitor) 322, a sensor (or monitor) 324, a sensor (or monitor) 326 and a sensor (or monitor) 330.

A signal (e.g., SWA) may be generated by the sensor 310 and received by the programmable controller 226. The signal SWA may carry door 118 open/closed information. A signal (e.g., SWB) may be generated by the sensor 312 and received by the programmable controller 226. The signal SWB may carry switch open/closed information for the main power disconnect switch 132. A signal (e.g., SWC) may be generated by the sensor 314 and received by the programmable controller 226. The signal SWC may carry switch open/closed information for the control power disconnect lever 112.

A signal (e.g., CT) may be generated by the sensor 316 and received by the programmable controller 226. The signal CT generally conveys current information for the electrical power entering the line-side power distribution block 130. A signal (e.g., FSA) may be generated by the sensor 320 and received by the programmable controller 226. The signal FSA may carry fuse status information for the fuse 304. A signal (e.g., FSB) may be generated by the sensor 322 and received by the programmable controller 226. The signal FSB may carry fuse status information for the main power disconnect switch 132. A signal (e.g., FSC) may be generated by the sensor 324 and received by the programmable controller 226. The signal FSC may carry fuse status information for the fuse 306. A signal (e.g., FSD) may be generated by the sensor 326 and received by the programmable controller 226. The signal FSD may carry fuse status information for the control power disconnect lever 112. A signal (e.g., ST) may be generated by the sensor 330 and received by the programmable controller 226. The signal ST may carry status information for the power converter 138.

The sensor 310 may implement a door switch configured to report an open/closed condition of the door 118 in the signal SWA. The sensor 312 may implement one or more switches configured to report an open/closed condition of the switches of the main power disconnect switch 132 in the signal SWB. The sensor 314 may implement a switch configured to report an open/closed condition of the control power disconnect lever 112 in the signal SWC. Other switch sensors may be implemented to meet the design criteria of a particular implementation.

The sensor 320 may implement a fuse status sensor configured to report an open/closed condition of the fuse 304 in the signal FSA. The sensor 322 may implement one or more fuse status sensors configured to report an open/closed condition of the fuses of the main power disconnect switch 132 via the signal FSB. The sensor 324 may implement a fuse status sensor configured to report an open/closed condition of the fuse 306 in the signal FSC. The sensor 326 may implement a fuse status sensors configured to report an open/closed condition of a fuse of the control power disconnect lever 112 via the signal FSD.

The sensor 316 may implement multiple (e.g., three) current toroid sensors. Each of the current toroid sensor 316 may be configured to report a current flow in a corresponding phase of the power line 150 in the signal CT. The sensor 330 may implement a power converter status sensor. The power converter status sensor 330 is generally operational to report a health of the power converter 138 in the signal ST. Other types of sensors may be implemented to meet the design criteria of a particular application.

Figure 13:
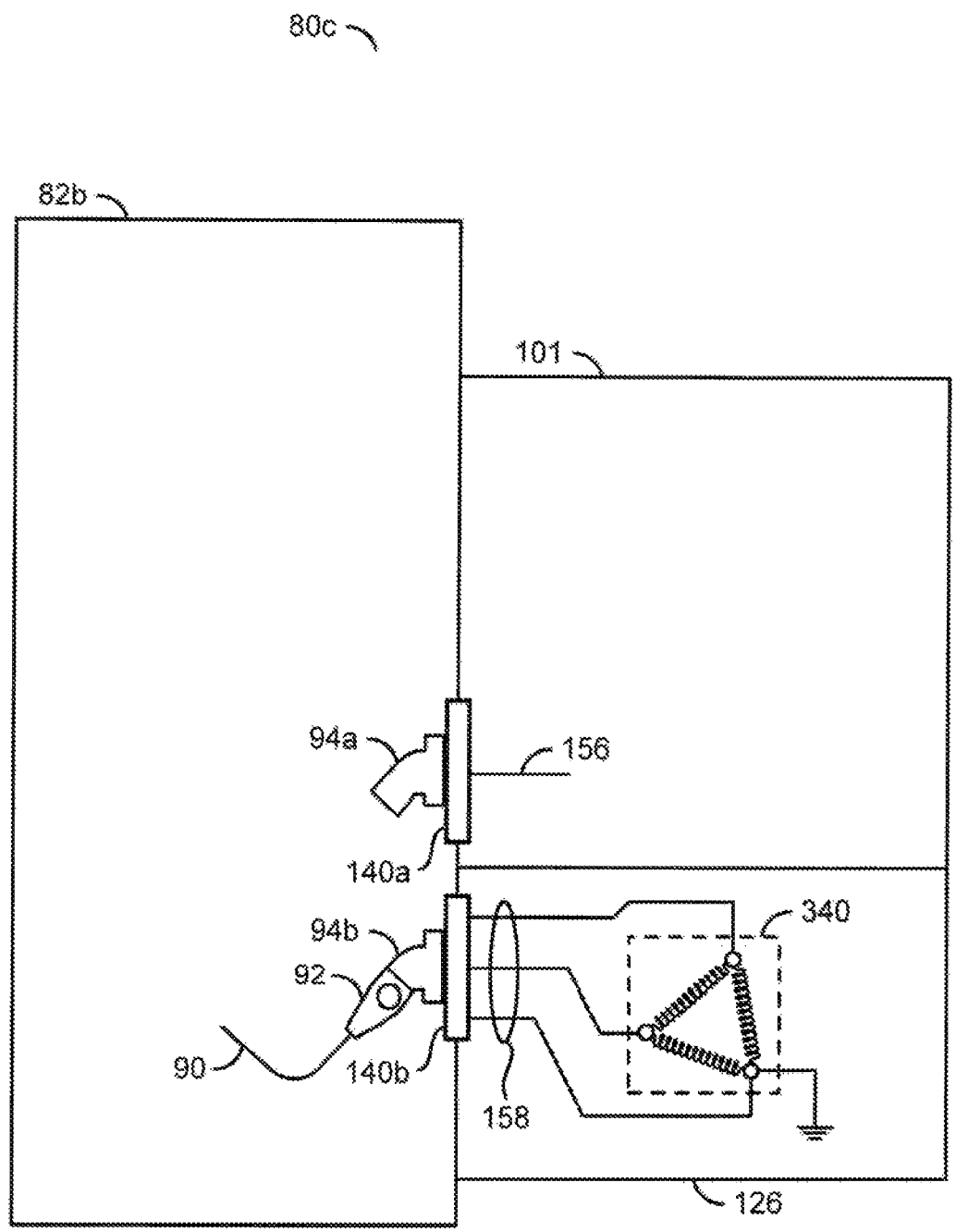
FIG. 13 is a block diagram of another variation of the system.

Referring to FIG. 13, a block diagram of another example implementation of a system 80c is shown. The system 80c may be a variation of the system 80b with a modified industrial control panel 82b and an extended enclosure 126. The extended enclosure 126 may be mounted below (as illustrated), above or to a side of the enclosure 101. The extended enclosure 126 generally comprises a power line (or wires) 158 and a resistor bank 340. The receptacle 94 in the industrial control panel 82a (FIG. 4) may be duplicated as a receptacle 94a and a receptacle 94b in the industrial control panel 82b.

The receptacle 94a may be connected to the power line 156 through the apertures 140a to receive multi-phase electrical power from the isolated control panel 100. The receptacle 94b may be connected to the resistor bank 340 through the apertures 140b and the power line 158. The resistor bank 340 generally comprises multiple (e.g., three) high-power resistors connected between the phases on the power line 158.

While and the industrial control panel 82b is open, the rated disconnect plug 92 may be manually disconnected from the receptacle 94a and plugged into the receptacle 94b. The receptacle 94b generally connects the resistor bank 340 across the phases of the power line 90. The resistor bank 340 may discharge residual energy storage elements (e.g., capacitors or the like) present in the industrial control panel 82b making the interior of the industrial control panel 82b safe. Before closing the industrial control panel 82b, the disconnect plug 92 may be manually disconnected from the receptacle 94b and plugged into the receptacle 94a.

Figure 14:
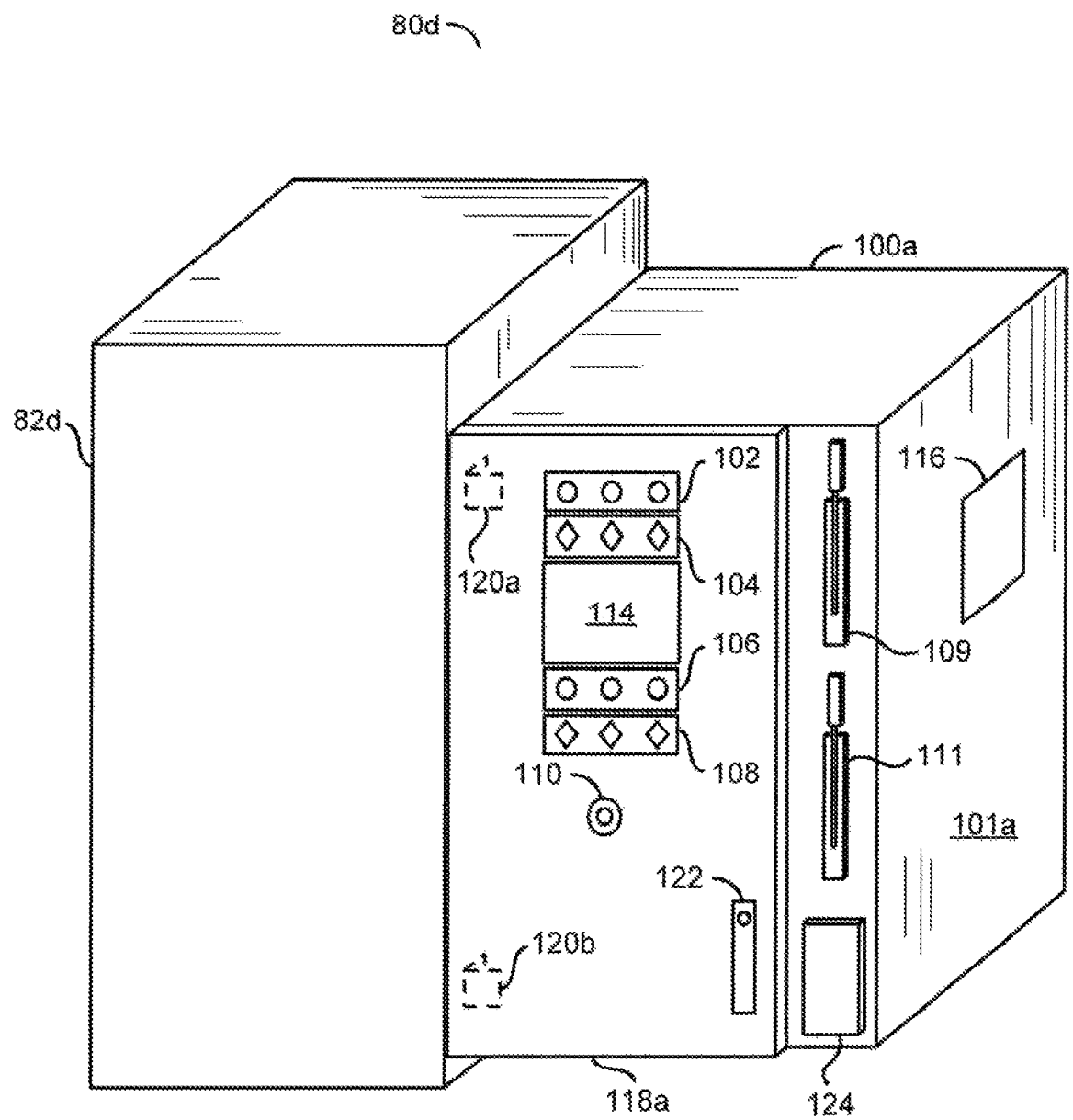
FIG. 14 is a diagram of a variation of the system.

Referring to FIG. 14, a diagram of another system 80d is shown. The system 80d may be a variation of the systems 80, 80a, 80b and/or 80c. The system (or apparatus) 80d may include features of the systems 80, 80a, 80b and/or 80c. The system 80d generally comprises an enclosure (or housing) 82d and an enclosure (or housing) 100a. The enclosure 82d may be a variation of the enclosures 82, 82a, 82b and/or 82c. The enclosure 82d may implement a common industrial control panel. The enclosure 100a may be a variation of the enclosure 100. The enclosure 100a may implement an isolated control panel. The isolated control panel 100a may be mechanically attachable to an external side of the industrial control panel 82d.

The industrial control panel 82d may be operational to switch and/or route high-voltage electrical power (e.g., 575 volts AC three-phase power) from an input source to one or more external loads. In some embodiments, the industrial control panel 82d may include the handle 84 mounted on the front of the industrial control panel 82d. In other embodiments, the handle 84 may be omitted from the industrial control panel 82d.

The isolated control panel 100a generally comprises an enclosure (or housing) 101a and a door 118a. The enclosure 101a generally comprises the indicators 102, the test points 104, the indicators, 106, the test points 108, a handle (or switch) 109, the control power status light 110, a handle (or switch) 111, the window 114, the optional window 116, the hinges 120a-120b, a lever (or handle) 122 and the one or more receptacles 124

The enclosure 101a may implement a rectangular-shaped box. The enclosure 101a may be configured to house various components and provide mechanical protection against electrical shock hazards, arc-flash hazards and/or arc-blast hazards. The enclosure 101a may be fabricated of an electrically conductive material (e.g., steel) and is electrically connected to the industrial control panel 82d for grounding purposes. In various embodiments, the enclosure 101a may be several feet tall (e.g., 46 inches), by approximately a foot wide (e.g., 15 inches) and approximately a foot deep (e.g., 12 inches). Other dimensions may be implemented to meet the design criteria of a particular application.

The handle 109 may implement a main power disconnect handle having an "on" position and an "off" position. In some embodiments, the main power disconnect handle 109 may be a fused power disconnect handle. The main power disconnect handle 109 is generally operational to switch high-voltage electrical power (e.g., 575 volts AC three-phase power) from an input source to the industrial control panel 82d. While the main power disconnect handle 109 is in the "on" position, the electrical power may be transferred from a power line to inside the industrial control panel 82d. While the main power disconnect handle 109 is in the "off" position, the high-voltage electrical power may be isolated from the industrial control panel 82d.

The handle 111 may implement a control power disconnect handle having an "on" position and an "off" position. The control power disconnect handle 111 is generally operational to switch the high-voltage electrical power (e.g., 575 or 480 volts AC three-phase power) from the input source to a power converter that generates one or more lower voltages (e.g., 120 volts AC single-phase power). While the control power disconnect handle 111 is in the "on" position, the electrical power may be transferred from the power line to the power converter. While the control power disconnect handle 111 is in the "off" position, the high-voltage electrical power may be isolated from the power converter.

The main power disconnect handle 109 and the control power disconnect handle 111 may be mounted on a same side of the enclosure 101a as the door 118a. The handles 109 and 111 are usually mounted on a side of the enclosure 101a (e.g., the right side) opposite the industrial control panel 82d. To accommodate the handles 109 and 111, the hinges 120a and 120b may be mounted inside the isolated control panel 100a on the side (e.g., left) closest to the industrial control panel 80d such that the door 118a swings open (e.g., to the left) away from the handles 109 and 111.

Figure 15:
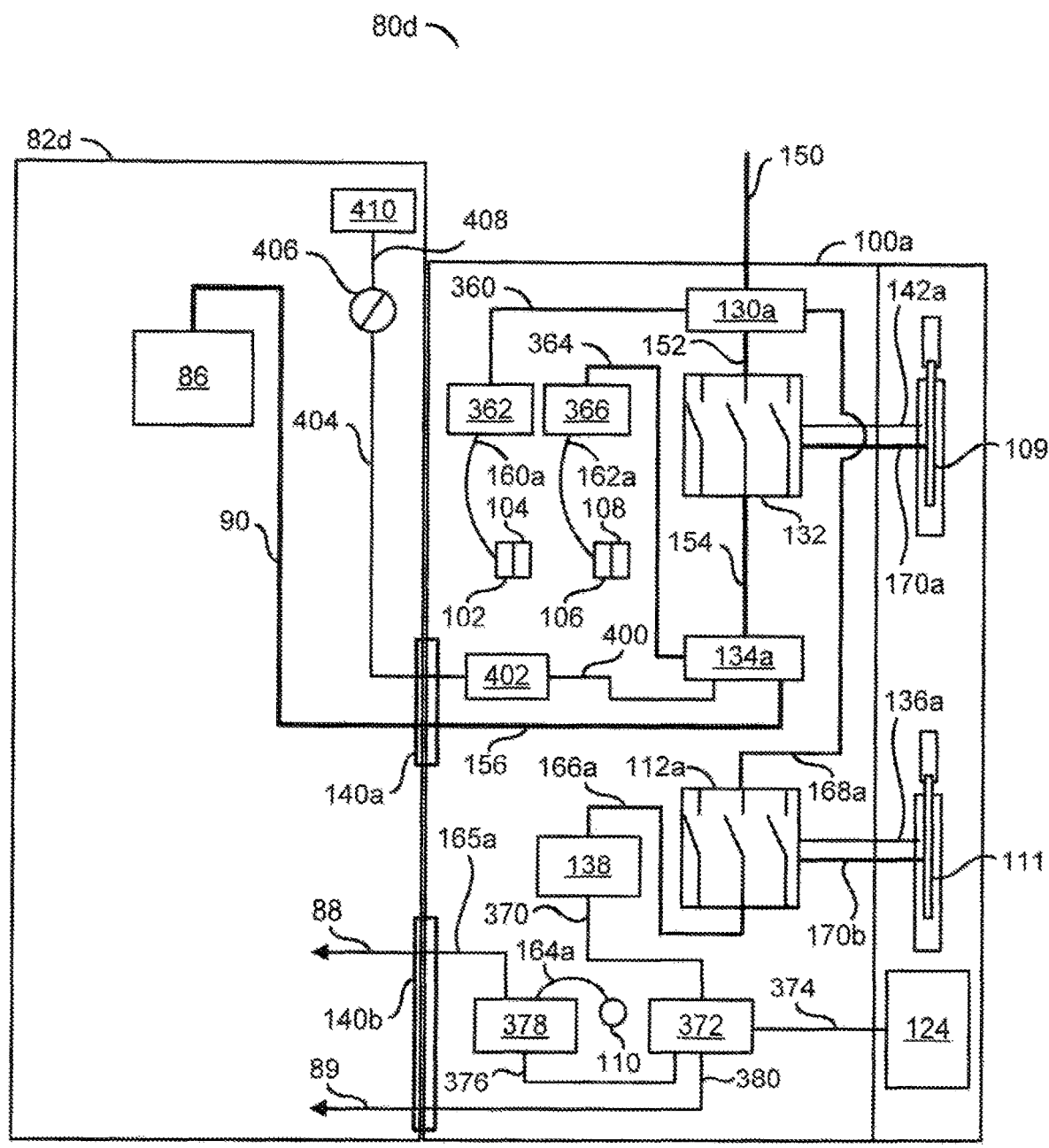
FIG. 15 is a block diagram of the system of FIG. 14 in accordance with an embodiment of the invention.

Referring to FIG. 15, a block diagram of an example implementation of the system 80d is shown in accordance with an embodiment of the invention. The industrial control panel 82d generally includes the branch circuit protector 86 (or a terminal connector or a distribution block), the low-voltage wire 88, the power line 90, a control wire 404, a switch 406, a wire 408 and an electrical actuator 410. The isolated control panel 100a generally includes the line-side voltage indicators 102, the line-side test station 104, the load-side voltage indicators 106, the load-side test station 108, the control power status light 110, the front window 114, the optional side window 116, the main power disconnect switch 132, the power converter 138, the apertures 140a and 140b, the power line 150, the power line 152, the power line 154 and the power line 156. The isolated control panel 100a may also comprise a block (or circuit) 112a, a block (or circuit) 130a, a block (or circuit) 134a, an interlock device (or mechanism) 136a, an interlock device (or mechanism) 142a, a power line (or wire) 160a, a power line (or wire) 162a, a power line (or wire) 164a, a power line (or wire) 165a, a power line (or wire) 166a, a power line (or wire) 168a, an actuator (or rod or cable) 170a, an actuator (or rod or cable) 170b, a power line (or wire) 360, a block (or circuit) 362, a power line (or wire) 364, a block (or circuit) 366, a power line (or wire) 370, a block (or circuit) 372, a power line (or wire) 376, a block (or circuit) 378, a power line (or wire) 380, a power line (or wire) 400 and a block (or circuit) 402.

The circuit 112a may implement a control power disconnect switch. The control disconnect switch 112a is generally operational to alternately connect and disconnect the multi-phase electrical power received from the line-side power distribution block 130a to the power converter 138. The control power disconnect switch 112a may be controlled by the actuator 170b.

The circuit 130a may implement a line-side power distribution block. The line-side power distribution block 130a is generally operational to distribute multiple-phase (e.g., three-phase) line-side electrical power from the multi-phase power line 150 to the main power disconnect switch 132. The electrical power may be transferred from the line-side power distribution block 130a to the main power disconnect switch 132 via the multi-phase power line 152. In various embodiments, the line-side power distribution block 130a may also distribute three-phase electrical power to the circuit 112a via the power line 168a and three-phase power to the circuit 362 via the power line 360. The current available on the power lines 150, 152, 168a and 360 may be a hazardous available fault current.

The main power disconnect switch 132 is generally operational to alternately connect and disconnect the multi-phase electrical power received from the line-side power distribution block 130a to the circuit 134a via the power line 154. The main power disconnect switch 132 may be controlled by the actuator 170a.

The circuit 134a may implement a load-side power distribution block. The load-side power distribution block 134a is generally operational to distribute multiple-phase (e.g., three-phase) load-side electrical power received from the main power disconnect switch 132 to the industrial control panel 82d via the multi-phase power line 156. The electrical power from the output side of the load-side power distribution block 134a may be connected to the branch circuit protector 86, located in the industrial control panel 82d. The power line 156 may pass through one or more apertures 140a-140b (e.g., 140a) in the walls of the isolated control panel 100a and continue in the industrial control panel 82d as the power line 90. The power line 90 is generally connected to the branch circuit protector 86. The multi-phase electrical power received by the load-side power distribution block 134a may also be transferred to the block 366 via the power line 364. Electrical power may also be transferred to the circuit 402 via the power wire 400.

The interlock device 136a is generally operational to keep the door 118a in the closed position while the control power disconnect handle 111 is in the "on" position. While the control power disconnect handle 111 is in the "off" position, the interlock device 136a may allow the door 118a to be open, if the interlock device 142a permits. The interlock device 136a may be defeatable with a standard tool. The interlock device 136a may also prevent the control power disconnect handle 111 from moving from the "off" position to the "on" position when the door 118a of the isolated control panel 100a is open. The locking feature of the interlock device 136a may also be manually defeatable.

The power converter 138 may receive electrical power from the line-side power distribution block 130a through the control disconnect switch 112a. While the control disconnect switch 112a is in the "on" position, electrical power may be supplied from the line-side power distribution block 130a, through power line 168a, through the control disconnect switch 112a, and through the power line 166a to the power converter 138. While the control disconnect switch 112a is in the "off" position, no electrical power is provided to the power converter 138. The low-voltage power may be presented by the power converter 138 on the power line 370 while electrical power is received on the power line 166a.

The interlock device 142a is generally operational to keep the door 118a in the closed position while the main power disconnect handle 109 is in the "on" position. While the main power disconnect handle 109 is in the "off" position, the interlock device 142a may allow the door 118a to be open, if the interlock device 136a permits. The interlock device 142a may be defeatable with a standard tool. The interlock device 142a may also prevent the main power disconnect handle 109 from moving from the "off" position to the "on" position when the door 118a of the isolated control panel 100a is open. The locking feature of the interlock device 142a may also be manually defeatable.

The circuit 362 may implement a terminal with optional circuit breakers and/or fuses. The terminal 362 is generally operational to distribute electrical power received from the line-side power distribution block 130a via the power line 360 to the line-side voltage indicators 102 and the line-side test station 104 via the power line 160a.

The circuit 366 may implement a terminal with optional circuit breakers and/or fuses. The terminal 366 is generally operational to distribute electrical power received from the load-side power distribution block 134a via the power line 364 to the load-side voltage indicators 106 and the load-side test station 108 via the power line 162a.

The circuit 372 may implement a power distribution block. The power distribution block 372 may be operational to distribute electrical power to the receptacles 124 via the power line 374 and to the circuit 378 via the power line 376. The power distribution block 372 may also distribute electrical power in the power line 380 through one of the apertures 140a-140b (e.g., 140b). Once inside the industrial control panel 82d, the power line 380 may continue as a power line 89.

The circuit 378 may implement an AC-to-DC power converter. The power converter 378 may be operational to convert the 120 volt AC electrical power received from the distribution block 372 to low-voltage electrical power (e.g., 24 volt DC power). The low-voltage DC power may be presented on the power line 165a, through one of the apertures 140a-140b (e.g., 140b) to the interior of the industrial control panel 82d. The power line 165a may continue as or be connected to the low-voltage wire 88 inside the aperture 140b. The power line 164a may transfer the low-voltage power to the control power status light 110.

The circuit 402 may implement a low energy power converter. The power converter 402 is generally operational to convert the high-voltage electrical power received from the load-side power distribution block 134a to a low energy AC or DC power. The low energy power may be presented through one of the apertures 140a-140b (e.g., 140a) on the power line 404 to the circuit 406.

The circuit 406 may implement a switch. In various embodiments, the switch 406 may be a tool-operated rotary switch. The switch 406 is generally operational to alternately pass or block the low energy power received from the power converter 402 from reaching the circuit 410 via the power line 408. In some embodiments, the switch 406 may be mounted to a door of the industrial control panel 82d. In other embodiments, the switch 406 may be mounted to the door 118a of the isolated control panel 100a. In such designs, the power line 404 may be internal to the isolated control panel 100a and the power line 408 may route through the aperture 140b to the circuit 410.

The circuit 410 may implement an interlock device. The interlock device 410 may have shot pin or solenoid lock that extends to a locked position while the low energy power is received from the switch 406. The shot pin may retract to an unlocked position when no low energy power is received from the switch 406.

The shot pin in the locked position may interfere with a catch mechanism on the door of the industrial control panel 82d thereby preventing the door from being opened. The shot pin in the unlocked position may clear the catch mechanism thus allowing the door to be opened. When the main power disconnect handle 109 is in the "off" position, power to the interlock device 410 may be removed (e.g., the load-side power distribution block 134a is de-energized) allowing the door to be opened. The interlock device 410 may also be defeated by setting the switch 406 to the "off" position thus allowing the door to be opened.

Figure 16:
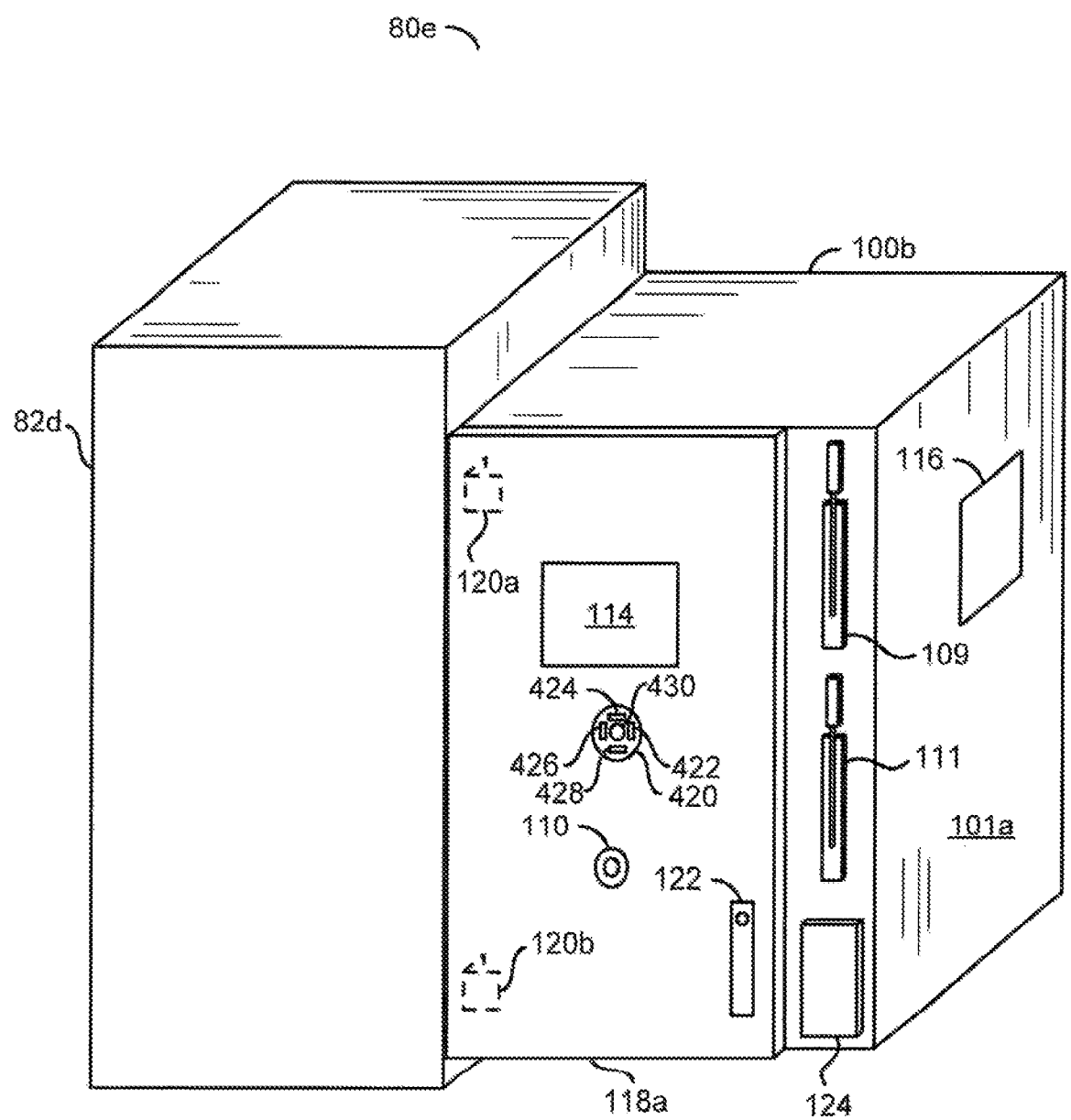
FIG. 16 is a diagram of another variation of the system.

Referring to FIG. 16, a diagram of another system 80e is shown. The system 80e may be a variation of the systems 80, 80a, 80b, 80c and/or 80d. The system (or apparatus) 80e may include features of the systems 80, 80a, 80b, 80c and/or 80d. The system 80e generally comprises the enclosure (or housing) 82d and an enclosure (or housing) 100b. The enclosure 82d may be a variation of the enclosures 82, 82a, 82b and/or 82c. The enclosure 82d may implement a common industrial control panel. The enclosure 100b may be a variation of the enclosure 100 and/or 100a. The enclosure 100b may implement an isolated control panel. The isolated control panel 100b may be mechanically attachable to an external side of the industrial control panel 82d.

The isolated control panel 100b generally comprises the enclosure (or housing) 101a and the door 118a. The enclosure 101a generally comprises the handle (or switch) 109, the control power status light 110, the handle (or switch) 111, the window 114, the optional window 116, the hinges 120a-120b, the lever (or handle) 122, the one or more receptacles 124, and an absence of voltage detector 420.

The absence of voltage detector 420 is disposed in the door 118a. The absence of voltage detector 420 generally includes multiple lamps 422-428, and a switch 430. Each lamp 422-426 generally indicates a presence or absence of a voltage on a corresponding phase of the multi-phase electrical power. While the switch 430 is not pressed, the lamps 422-426 are bright if the voltages are present in the multiple phases. While the switch 430 is not pressed, the lamps 422-426 are dark if the voltage voltages are absence from the multiple phases. The lamp 428 may be dark to indicate that the electrical power is off while the switch 430 is not pressed. The lamp 428 may be bright while the switch 430 is pressed to indicate that no electrical power is present on any of the multiple phases.

Figure 17:
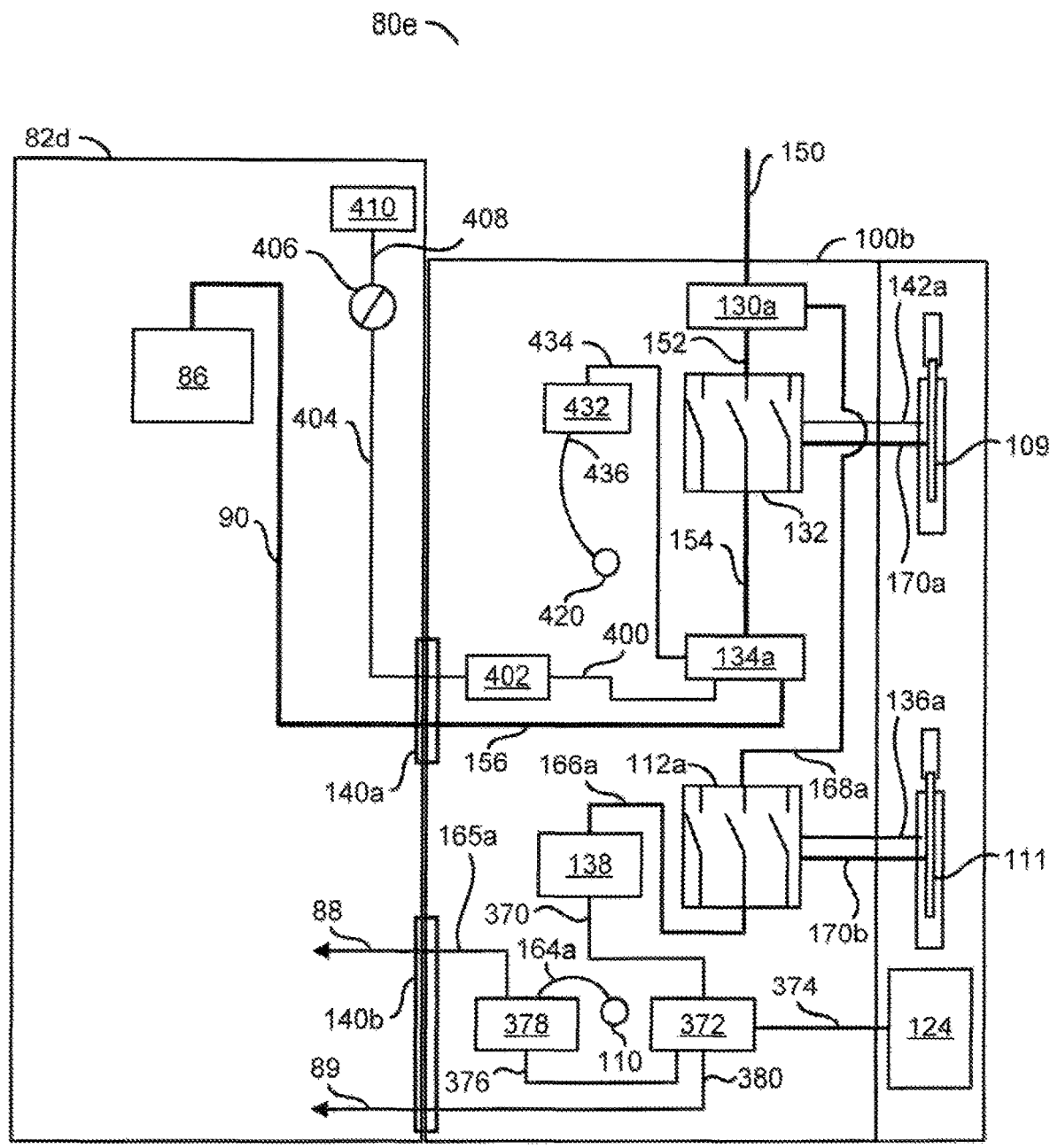
FIG. 17 is a block diagram of the system of FIG. 16 in accordance with an embodiment of the invention.

Referring to FIG. 17, a block diagram of an example implementation of the system 80e is shown in accordance with an embodiment of the invention. The industrial control panel 82d generally includes the branch circuit protector 86 (or a terminal connector or a distribution block), the low-voltage wire 88, the power line 90, the control wire 404, the switch 406, the wire 408 and the electrical actuator 410. The isolated control panel 100b generally includes the control power status light 110, control disconnect switch 112a, the front window 114, the optional side window 116, the line-side power distribution block 130a, the main power disconnect switch 132, the load-side power distribution block 134a, the interlock device (or mechanism) 136a, the power converter 138, the apertures 140a and 140b, the interlock device (or mechanism) 142a, the power line 150, the power line 152, the power line 154, and the power line 156. The isolated control panel 100b may also comprise the power line (or wire) 164a, the power line (or wire) 165a, the power line (or wire) 166a, the power line (or wire) 168a, the actuator (or rod or cable) 170a, the actuator (or rod or cable) 170b, the power line (or wire) 370, the distribution block 372, the power line (or wire) 376, the power converter 378, the power line (or wire) 380, the power line (or wire) 400 and the power converter 402. The isolated control panel 100b may include the absence of voltage detector 420, an absent of voltage detector controller 432, multiple sense wires 434, and a harness 436.

The absence of voltage detector 420 is operational to present illuminated and/or dark indicators 422-428 based on the presence or absence of voltages on the sense wires 434. The absence of voltage detector 420 is also operational to determine when the switch 430 is pressed and when the switch 430 is released. Electrical power for the absence of voltage detector 420 may be provided by an internal battery.

The absence of voltage detector controller 432 is operational to sense the presence or absence of voltages on the multiple phases in the load-side power distribution block 134a via the sense wires 434. The sensing is presented via the harness 436 to the absence of voltage detector 420. Electrical power for the absence of voltage detector controller 432 may be provided by an internal battery. In various embodiments, the absence of voltage detector 420, the absence of voltage detector controller 432, the sense wires 434 and the harness 436 may be provided by the Panduit Corporation, Tinley Park, IL The functions and structures illustrated in the diagrams of FIGS. 1 to 17 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
    an enclosure comprising a door;
    a power switch mounted inside said enclosure and configured to switch electrical power from a line-side power line to a load-side power line, wherein said load-side power line is configured to transfer said electrical power outside of said enclosure to an industrial control panel;
    a controller coupled to said power switch and configured to determine a presence and an absence of each of a plurality of phases of said electric power on said load-side power line inside said enclosure; and
    a detector coupled to said controller, wherein said detector has a switch accessible from external to said enclosure, has one or more lamps that are visible from external to said enclosure, and is configured to illuminate said one or more lamps indicating said absence of said electrical power on a corresponding one or more of said plurality of phases in response to a pressing of said switch.

2. The apparatus according to claim 1, wherein said controller and said detector are powered internally.

3. The apparatus according to claim 1, further comprising an additional power switch mounted inside said enclosure and configured to switch said electric power from said line-side power line to one or more power converters.

4. The apparatus according to claim 3, further comprising a power disconnect handle mounted on said enclosure and configured to control said power switch.

5. The apparatus according to claim 4, further comprising an additional power disconnect handle mounted on said enclosure and configured to control said additional power switch.

6. The apparatus according to claim 5, further comprising a plurality of interlock devices configured to prevent said door from opening while at least one of said power disconnect handle and said additional power disconnect handle is at an on position.

7. The apparatus according to claim 6, wherein said plurality of interlock devices are further configured to prevent each of said power disconnect handle and said additional power disconnect handle from moving from an off position to said on position while said door is open.

8. The apparatus according to claim 1, further comprising one or more power converters coupled to said line-side power line and configured to generate a low-voltage electrical power from a single-phase electrical power of said electrical power, wherein said low-voltage electrical power is transferred outside of said enclosure.

9. The apparatus according to claim 8, wherein said single-phase electrical power is switchable by an additional power switch that is mounted inside said enclosure and coupled between said line-side power line and said one or more power converters.

10. The apparatus according to claim 9, wherein one or more of said power converters comprises a transformer configured to generate said low-voltage electrical power from said single-phase electrical power.

11. The apparatus according to claim 10, wherein said one or more power converters further comprise an AC-to-DC converter configured to generate an additional low-voltage electrical power from said single-phase electrical power.

12. The apparatus according to claim 1, further comprising a plurality of test points (i) mounted on said door, (ii) accessible from outside said enclosure and (iii) configured to present at least one of (a) a phase-to-phase voltage and (b) a phase-to-ground voltage from each phase of said electrical power from said load-side power line.

13. The apparatus according to claim 1, further comprising at least one of (i) a horn and (ii) a beacon configured to trigger while said door is open and said electrical power is present on said line-side power line.

14. The apparatus according to claim 1, further comprising:
    a window mounted inside said enclosure; and
    a frame attached to said enclosure to secure said window against said enclosure.

15. The apparatus according to claim 8, further comprising a programmable controller (i) mounted inside said enclosure, (ii) powered by said low-voltage electrical power and (iii) configured to report a plurality of sensor signals to a remote monitor external to said enclosure.

16. The apparatus according to claim 1, further comprising a resistor bank configured to discharge energy stored in said industrial control panel.

17. The apparatus according to claim 1, wherein said enclosure further comprises a relief chamber configured to direct at least one of (i) an arc-flash and (ii) an arc-blast out of said enclosure in a predetermined direction.

18. A method for risk reduction of electrical hazards comprising:
    switching electrical power with a power switch from a line-side power line to a load-side power line inside an enclosure, wherein said load-side power line is configured to transfer said electrical power outside of said enclosure to an industrial control panel, and said power switch is mounted inside said enclosure;
    determining with a controller a presence and an absence of each of a plurality of phases of said electric power on said load-side power line inside said enclosure, wherein said controller is coupled to said power switch; and illuminating one or more lamps of a detector to indicate said absence of said electrical power on a corresponding one or more of said plurality of phases in response to pressing a switch on said detector, wherein said detector is coupled to said controller, said switch of said detector is accessible from external to said enclosure, and said one or more lamps of said detector are visible from external to said enclosure.

19. The method according to claim 18, further comprising:

switching said electrical power with an additional power switch from said line-side of said power switch to one or more power converters, wherein said additional power switch is mounted inside said enclosure;.

20. The method according to claim 18, wherein:

said enclosure further comprises one or more apertures;

said enclosure is mechanically attachable to a wall of said industrial control panel; and one or more openings in said wall of said industrial control panel align with said one or more apertures in said enclosure.

\* \* \* \* \*